(12) United States Patent
Miyagawa et al.

(10) Patent No.: US 9,806,091 B2
(45) Date of Patent: Oct. 31, 2017

(54) SEMICONDUCTOR MEMORY DEVICE

(71) Applicant: Toshiba Memory Corporation, Minato-ku (JP)

(72) Inventors: Hidenori Miyagawa, Yokkaichi (JP); Tomoya Kawai, Kawasaki (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/271,385

(22) Filed: Sep. 21, 2016

(65) Prior Publication Data

US 2017/0271349 A1    Sep. 21, 2017

(30) Foreign Application Priority Data

Mar. 18, 2016 (JP) ................................. 2016-056215

(51) Int. Cl.

| *H01L 27/115* | (2017.01) |
|---|---|
| *H01L 21/822* | (2006.01) |
| *H01L 21/28* | (2006.01) |
| *H01L 27/11556* | (2017.01) |
| *H01L 27/11519* | (2017.01) |

(Continued)

(52) U.S. Cl.
CPC .... *H01L 27/11556* (2013.01); *H01L 23/5283* (2013.01); *H01L 23/53209* (2013.01); *H01L 27/11519* (2013.01)

(58) Field of Classification Search
CPC ......... H01L 27/11556; H01L 27/11519; H01L 27/11578; H01L 27/11582; H01L 27/1157; H01L 23/5283; H01L 27/53209; H01L 21/8221; H01L 21/28282

USPC ... 257/319, 324, E29.309, E21.21, E21.409; 438/264, 266, 268, 478
See application file for complete search history.

(56) References Cited

U.S. PATENT DOCUMENTS

| 8,187,936 B2 * | 5/2012 | Alsmeier .......... H01L 27/11551 257/324 |
|---|---|---|
| 9,070,589 B2 | 6/2015 | Kawai et al. |
| 9,123,749 B2 | 9/2015 | Kawai et al. |

(Continued)

FOREIGN PATENT DOCUMENTS

| JP | 2013-534058 A | 8/2013 |
|---|---|---|
| JP | 2014-175348 A | 9/2014 |

(Continued)

*Primary Examiner* — Dao H Nguyen
(74) *Attorney, Agent, or Firm* — Oblon, McClelland, Maier & Neustadt, L.L.P.

(57) ABSTRACT

A semiconductor memory device according to an embodiment comprises: a plurality of control gate electrodes arranged in a first direction intersecting an upper surface of a substrate; a semiconductor layer extending in the first direction and facing a plurality of the control gate electrodes from a second direction intersecting the first direction; and a gate insulating layer provided between the control gate electrode and the semiconductor layer. The semiconductor layer comprises: a first portion extending in the first direction and facing a plurality of the control gate electrodes; and a second portion provided on a closer side to the substrate than this first portion. A film thickness of the first portion in the second direction is larger than a film thickness of the second portion in the second direction. A crystal grain included in the first portion is larger than a crystal grain included in the second portion.

16 Claims, 35 Drawing Sheets

(51) Int. Cl.
*H01L 23/532* (2006.01)
*H01L 23/528* (2006.01)

(56) References Cited

U.S. PATENT DOCUMENTS

| | | | |
|---|---|---|---|
| 2011/0018052 A1* | 1/2011 | Fujiwara | H01L 27/11526 257/324 |
| 2014/0227841 A1* | 8/2014 | Lee | H01L 27/1157 438/268 |
| 2015/0069496 A1 | 3/2015 | Shiga | |
| 2016/0307914 A1* | 10/2016 | Sun | H01L 29/7889 |

FOREIGN PATENT DOCUMENTS

| JP | 2014-179465 A | 9/2014 |
|---|---|---|
| JP | 2015-56434 A | 3/2015 |

* cited by examiner

SEMICONDUCTOR MEMORY DEVICE

CROSS-REFERENCE TO RELATED APPLICATIONS

This application s based upon and claims the benefit of Japanese Patent Application No. 2016-056215, filed on Mar. 18, 2016, the entire contents of which are incorporated herein by reference.

FIELD

Embodiments described herein relate to a semiconductor memory device.

BACKGROUND

Description of the Related Art

In recent years, a semiconductor memory device in which memory cells are disposed three-dimensionally (a three-dimensional type semiconductor memory device) has been proposed. Such a semiconductor memory device comprises, for example: a plurality of control gate electrodes arranged in a first direction intersecting an upper surface of a substrate; a semiconductor layer extending in the above-described first direction and facing the above-described plurality of control gate electrodes; and a gate insulating layer provided between the above-described control gate electrode and semiconductor layer and capable of accumulating a charge.

DETAILED DESCRIPTION

Figure 1:
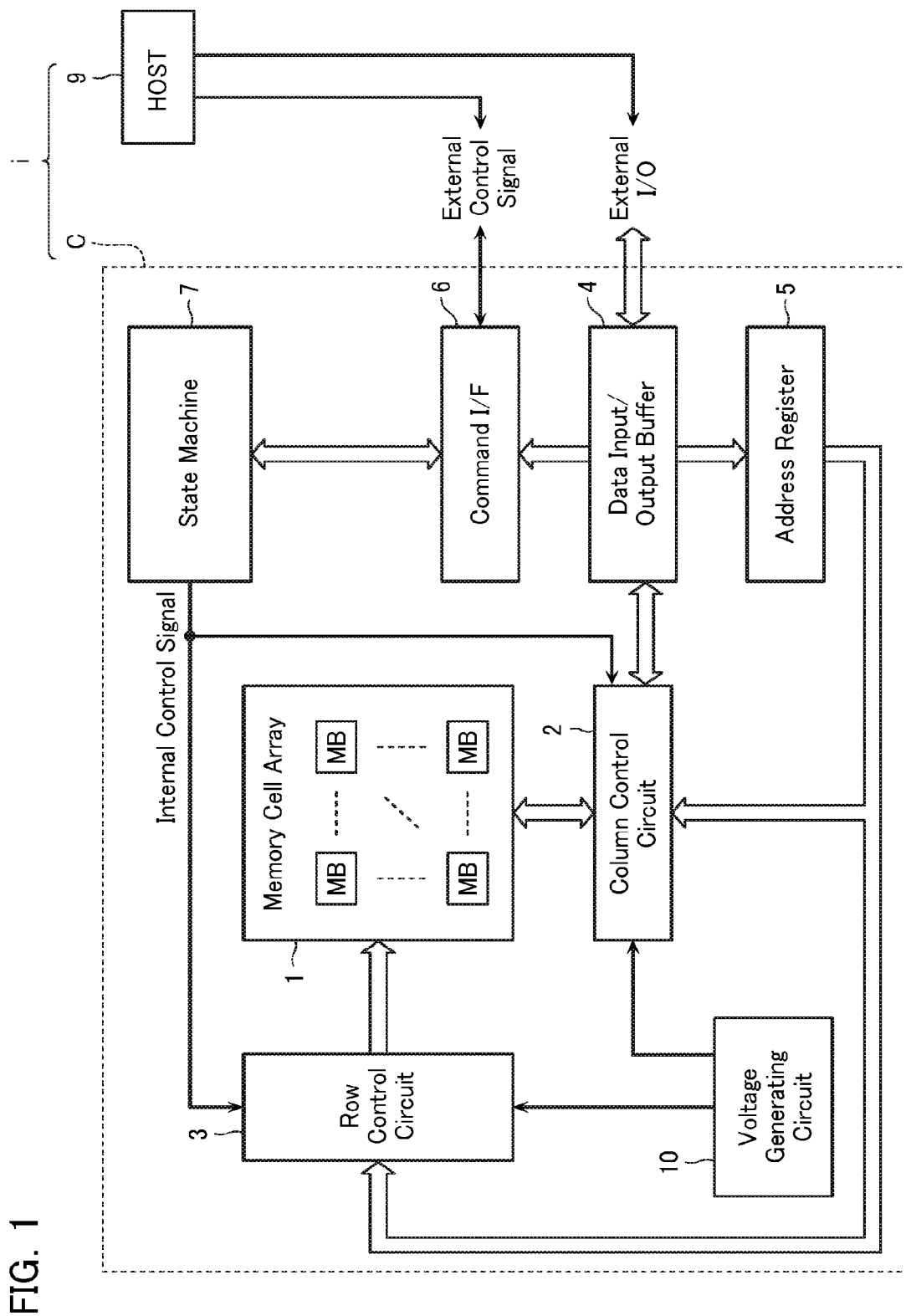
FIG. 1 is a block diagram of a semiconductor memory device according to a first embodiment.

A semiconductor memory device according to an embodiment comprises a plurality of control gate electrodes, a semiconductor layer, and a gate insulating layer. The plurality of control gate electrodes are arranged in a first direction intersecting an upper surface of a substrate. The semiconductor layer extends in the first direction and faces a plurality of the control gate electrodes from a second direction intersecting the first direction. The gate insulating layer is provided between the control gate electrode and the semiconductor layer. Moreover, the semiconductor layer comprises a first portion and a second portion. The first portion extends in the first direction and faces a plurality of the control gate electrodes. The second portion is provided on a closer side to the substrate than the first portion. Moreover, a film thickness of the fi first portion in the second direction is larger than a film thickness of the second portion in the second direction. Moreover, a crystal grain included in the first portion is larger than a crystal grain included in the second portion.

Next, semiconductor memory devices according to embodiments will be described in detail with reference to the drawings. Note that these embodiments are merely examples, and are not shown with the intention of limiting the present invention.

For example, the semiconductor memory devices described below comprise: a plurality of control gate electrodes arranged in a first direction intersecting an upper surface of a substrate; a semiconductor layer extending in the first direction and facing the above-described plurality of control gate electrodes; and a gate insulating layer provided between these control gate electrode and semiconductor layer.

The above-described control gate electrode may be formed from a metal such as tungsten (W), or may be formed from a semiconductor such as polysilicon.

The above-described semiconductor layer may be connected at its one end (lower end) to a semiconductor substrate, or may be connected to a wiring line configured from the likes of a metal or a semiconductor. Moreover, one ends (lower ends) of two or more of the semiconductor layers may be joined by the likes of a metal or a semiconductor.

The above-described gate insulating layer may include a charge accumulation part. This charge accumulation part may be configured from a charge accumulation layer configured from the likes of a nitride, or may be configured from a floating gate configured from the likes of a semiconductor.

Moreover, in the description below, a direction intersecting the upper surface of the substrate will be called a first direction, and a direction intersecting the first direction will be called a second direction. In addition, a direction moving away from the substrate along the first direction will be called upward, and a direction moving towards the substrate along the first direction will be called downward. Moreover, when a lower surface is referred to for a certain configuration, this is assumed to mean a surface facing the substrate of this configuration, and when an upper surface is referred to for a certain configuration, this is assumed to mean a surface on an opposite side to the substrate of this configuration. In addition, a direction following the second direction will be called lateral. Moreover, a surface intersecting the second direction will be called a side surface. In addition, a certain direction parallel to a surface of the substrate will be called an X direction, a direction parallel to the surface of the substrate and perpendicular to the X direction will be called a Y direction, and a direction perpendicular to the surface of the substrate will be called a Z direction. Note that the description below exemplifies the case where the first direction corresponds with the Z direction, and the second direction corresponds with the X direction or the Y direction, but the first and second directions need not correspond with the Z direction, the X direction, and the Y direction.

First Embodiment

[Configuration]

FIG. 1 is a block diagram of a semiconductor memory device according to a first embodiment. Note that the semiconductor memory device referred to herein means, for example, the likes of a chip C storing user data or an electronic device i (for example, a smartphone, a mobile phone, a tablet terminal, a music player, a wearable terminal, and so on) installed with this chip C. Moreover, user data refers to, for example, data expressing contents (a character string, a sound, an image, a moving picture, and so on) utilized by a user, and is expressed by a combination of "0"s and "1"s.

The electronic device i comprises: the chip C; and a host 9 controlling this chip C. The chip C comprises: a memory cell array 1; and a column control circuit 2, a row control circuit 3, a data input/output buffer 4, an address register 5, a command interface 6, a state machine 7, and a voltage generating circuit 10 that control this memory cell array 1. The memory cell array 1 comprises a plurality of memory blocks MB. These memory blocks MB each record user data. The column control circuit 2 comprises an unshown sense amplifier, and performs read of user data, and so on. Moreover, the column control circuit 2, when performing write of user data, transfers a voltage to the memory cell array 1, according to inputted user data. The row control circuit 3 specifies a position for performing read or write of user data in the memory cell array 1, according to inputted address data. The data input/output buffer 4 performs input/output control of user data, address data, and command data. The address register 5 stores address data and supplies the address data to the column control circuit 2 and the row control circuit 3. The state machine 7 receives an external control signal from the host 9, via the command interface 6, and inputs an internal control signal to the column control circuit 2 and the row control circuit 3. The voltage generating circuit 10 generates a voltage and supplies the voltage to the column control circuit 2 and the row control circuit 3.

Figure 2:
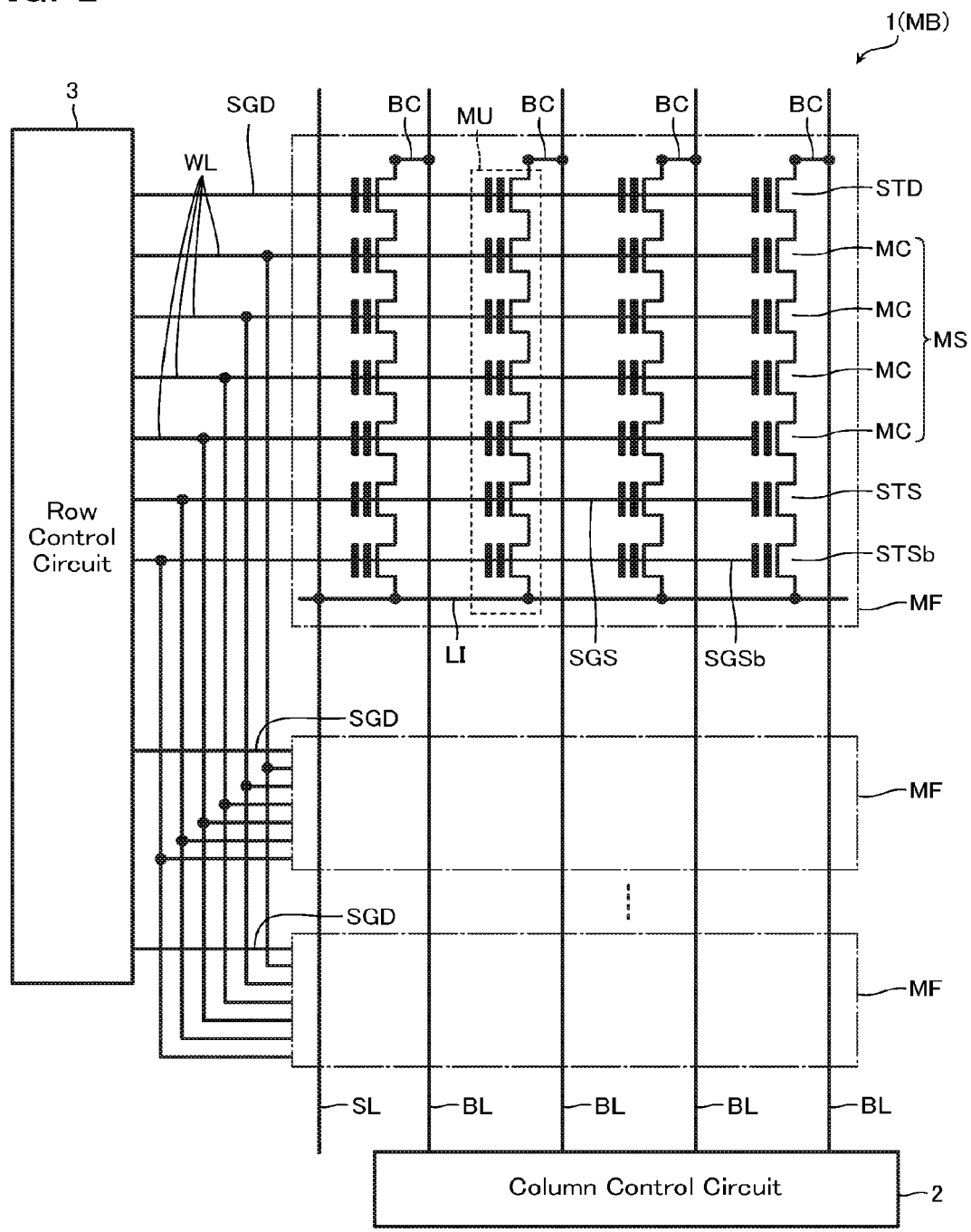
FIG. 2 is a circuit diagram showing a configuration of part of the same semiconductor memory device.

FIG. 2 is an equivalent circuit diagram showing a configuration of the memory block MB configuring the memory cell array 1. The memory block MB is connected to the column control circuit 2 via a bit line BL, to the row control circuit 3 via a word line WL, and to an unshown source line driver via a source line SL. Note that for convenience of description, part of the configuration is omitted in FIG. 2.

The memory block MB comprises a plurality of memory fingers MF. The memory finger MF comprises a plurality of memory units MU. One ends of these plurality of memory units MU are respectively connected to the bit lines BL via bit line contacts BC. Moreover, the other ends of these plurality of memory units MU are each connected to the source line SL via a common source line contact LI. The memory unit MU comprises a drain side select gate transistor STD, a memory string MS, a source side select gate transistor STS, and a lowermost layer source side select gate transistor STSb that are connected in series between the bit line contact BC and the source line contact LI.

The memory string MS comprises a plurality of memory cells MC connected in series. The memory cell MC is a field effect transistor that comprises: a semiconductor layer functioning as a channel body; a gate insulating layer capable of accumulating a charge; and a control gate electrode, and stores a one-bit portion or a multiple-bit portion of data configuring user data. A threshold voltage of the memory cell MC changes according to a charge amount in the gate insulating layer. Note that the word lines WL are respectively connected to the control gate electrodes of the plurality of memory cells MC belonging to an identical memory string MS. The word line WL is provided commonly for all of the memory strings MS in the memory block MB.

The drain side select gate transistor STD, the source side select gate transistor STS, and the lowermost layer source side select gate transistor STSb are field effect transistors that comprise: a semiconductor layer functioning as a channel body; and a control gate electrode. A common drain side select gate line SGD is connected to the plurality of drain side select gate transistors STD belonging to an identical memory finger MF. Moreover, a common source side select gate line SGS and a common lowermost layer source side select gate line SGSb are respectively connected to the control gate electrodes of the pluralities of source side select gate transistors STS and lowermost layer source side select gate transistors STSb that belong to an identical memory block MB.

Note that in the description below, the lowermost layer source side select gate transistor STSb, the source side select gate transistor STS, and the drain side select gate transistor STD will sometimes simply be called select gate transistors (STSb, STS, STD). Moreover, the lowermost layer source side select gate line SGSb, the source side select gate line SGS, and the drain side select gate line SGD will sometimes simply be called select gate lines (SGSb, SGS, SGD).

Figure 3:
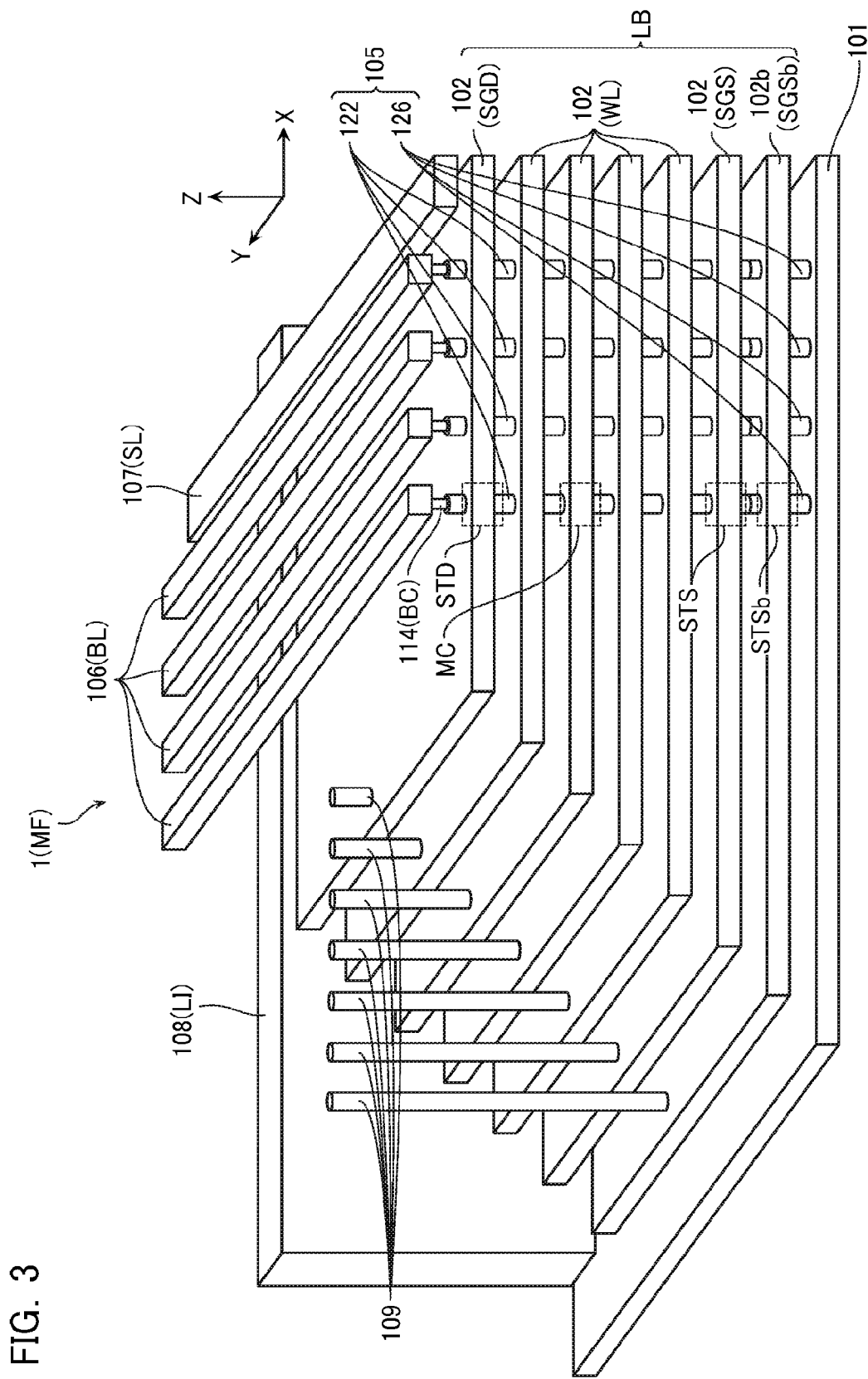
FIG. 3 is a perspective view showing a configuration of part of the same semiconductor memory device.

FIG. 3 is a schematic perspective view showing a configuration of part of the memory finger MF. Note that FIG. 3 describes a three-dimensional structure of the likes of a wiring line or the memory cell MC, and does not show an inter-layer insulating layer provided between the wiring lines, and so on. Moreover, FIG. 3 is shown for description, and a specific configuration may be appropriately changed.

The memory finger MF is provided upwardly of a substrate 101, and includes: a stacked body LB provided upwardly of the substrate 101; and a memory columnar body 105 which has a substantially circular column shape and whose side surface is covered by the stacked body LB.

The substrate 101 is a semiconductor substrate configured from the likes of monocrystalline silicon (Si), for example. The substrate 101 comprises, for example, a double well structure that includes an N type impurity layer on an upper surface of the semiconductor substrate and further includes a P type impurity layer in this N type impurity layer.

The stacked body LB includes a plurality of conductive layers 102 arranged in the Z direction. These conductive layers 102 respectively function as the word line WL and control gate electrode of the memory cell MC, or as the select gate lines (SGSb, SGS, SGD) and control gate electrodes of the select gate transistors (STSb, STS, STD). The conductive layer 102 is configured from a conductive layer of the likes of tungsten (W), for example. The conductive layer 102 extends in the X direction and the Y direction, and has a substantially plate-like shape having longitudinally the X direction. The conductive layers 102 are each connected to the row control circuit 3 (FIGS. 1 and 2) via a contact 109 extending in the Z direction. Note that the contact 109 is configured from a conductive layer of the likes of tungsten (W). Note that in the description below, the most downwardly positioned one (the one closest to the substrate 101) of the plurality of conductive layers 102 will sometimes be called a second conductive layer 102b.

The memory columnar body 105 has a circular column shape extending in the Z direction. An intersection of the memory columnar body 105 and the conductive layer 102 functions as the memory cell MC or the select gate transistors (STSb, STS, STD). The memory columnar body 105 includes: a semiconductor layer 122 extending in the Z direction; and a second semiconductor layer 126 connected to a lower end (an end closest to the substrate 101) of this semiconductor layer 122. The semiconductor layer 122 faces the plurality of conductive layers 102, and functions as a channel body of the memory cell MC and the select gate transistors (STS, STD). The second semiconductor layer 126 faces the second conductive layer 102b, and functions as a channel body of the lowermost layer source side select gate transistor STSb. The lower end of the semiconductor layer 122 is electrically connected, via the second semiconductor layer 126 and the substrate 101, to a conductive layer 108 functioning as the source line contact LI. The conductive layer 108 is electrically connected to the unshown source line driver, via a conductive layer 107 functioning as the source line SL. An upper end of the semiconductor layer 122 is electrically connected to a conductive layer 114 functioning as the bit line contact BC. The conductive layer 114 is electrically connected to the column control circuit 2 (FIGS. 1 and 2) via a conductive layer 106 functioning as the bit line BL. Note that the conductive layer 106, the conductive layer 107, the conductive layer 108, and the conductive layer 114 are configured from a conductive layer of the likes of tungsten (W). Moreover, the conductive layer 106 and the conductive layer 107 are arranged in plurality in the X direction, and extend in the Y direction. The conductive layer 108 comprises a substantially plate-like shape extending in the X direction and the Z direction and having longitudinally the X direction, and is connected, at its lower surface, to the substrate 101. The conductive layers 114 extend in the Z direction and are each connected to one semiconductor layer 122 and one conductive layer 106.

Figure 4:
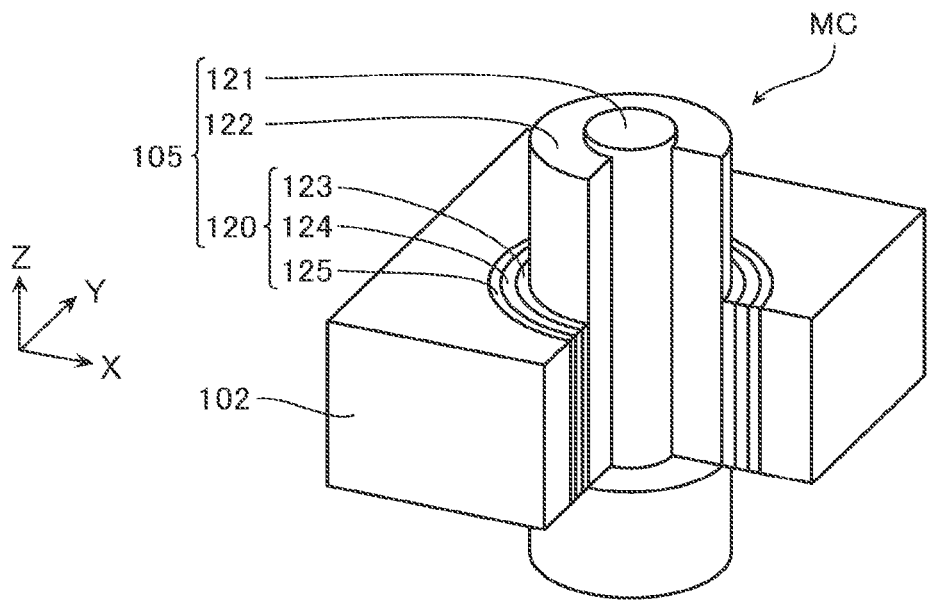
FIG. 4 is a perspective view showing a configuration of part of the same semiconductor memory device.

FIG. 4 is a schematic perspective view showing a configuration of the memory cell MC. Note that FIG. 4 shows the configuration of the memory cell MC, but the select gate transistors (STS, STD) may also be configured similarly to the memory cell MC. Note that in FIG. 4, part of the configuration is omitted.

The memory cell MC is provided at an intersection of the conductive layer 102 and the memory columnar body 105. The memory columnar body 105 comprises: a core insulating layer 121 of a circular column shape extending in the Z direction; the semiconductor layer 122 covering a side surface of the core insulating layer 121; and a gate insulating layer 120 covering a side surface of the semiconductor layer 122. The gate insulating layer 120 comprises: a tunnel insulating layer 123 covering the side surface of the semiconductor layer 122; a charge accumulation layer 124 covering a side surface of the tunnel insulating layer 123; and a block insulating layer 125 covering a side surface of the charge accumulation layer 124.

The core insulating layer 121 is configured from an insulating layer of the likes of silicon oxide ($SiO_2$), for example. The semiconductor layer 122 is configured from a semiconductor layer of the likes of polysilicon, for example, and is formed in a substantially cylindrical shape extending in the Z direction along the side surface of the core insulating layer 121. The gate insulating layer 120 is provided between the conductive layer 102 and the semiconductor layer 122, and is formed in a substantially cylindrical shape extending in the Z direction along the side surface of the semiconductor layer 122. The tunnel insulating layer 123 is configured from an insulating layer of the likes of silicon oxide ($SiO_2$), for example. The charge accumulation layer 124 is configured from an insulating layer capable of accumulating a charge, of the likes of silicon nitride ($Si_3N_4$), for example, and configures the charge accumulation part. The block insulating layer 125 is configured from an insulating layer of the likes of silicon oxide ($SiO_2$) or alumina ($Al_2O_3$), for example.

Figure 5:
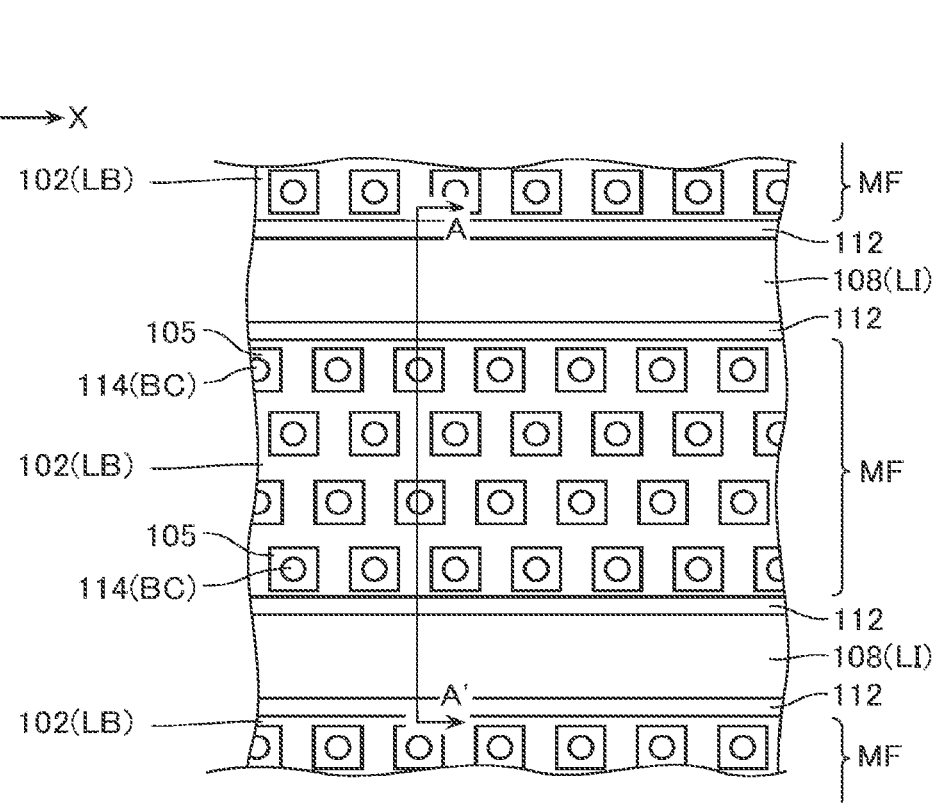
FIG. 5 is a plan view showing a configuration of part of the same semiconductor memory device.
Figure 6:
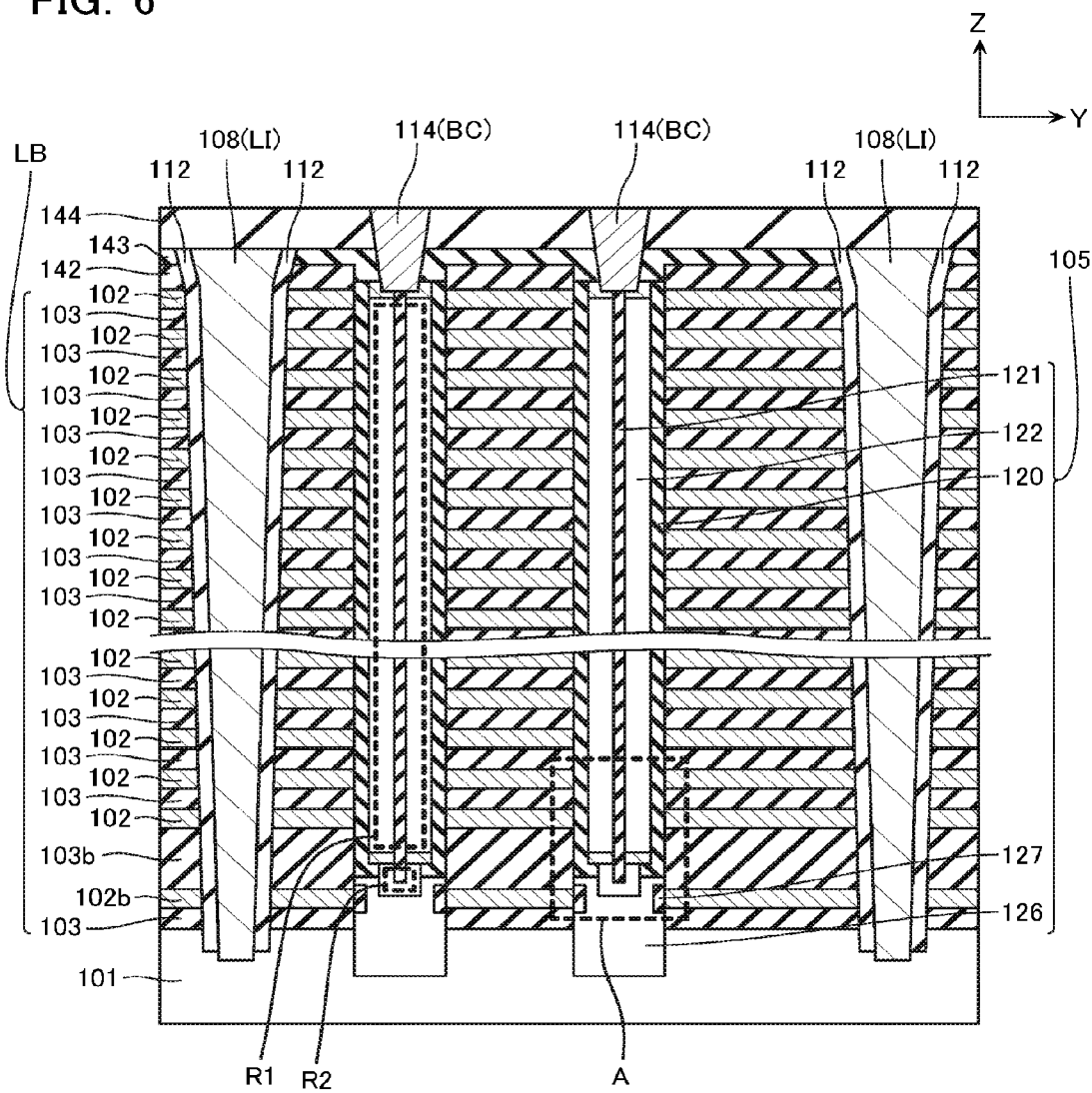
FIG. 6 is a cross-sectional view showing a configuration of part of the same semiconductor memory device.
Figure 7:
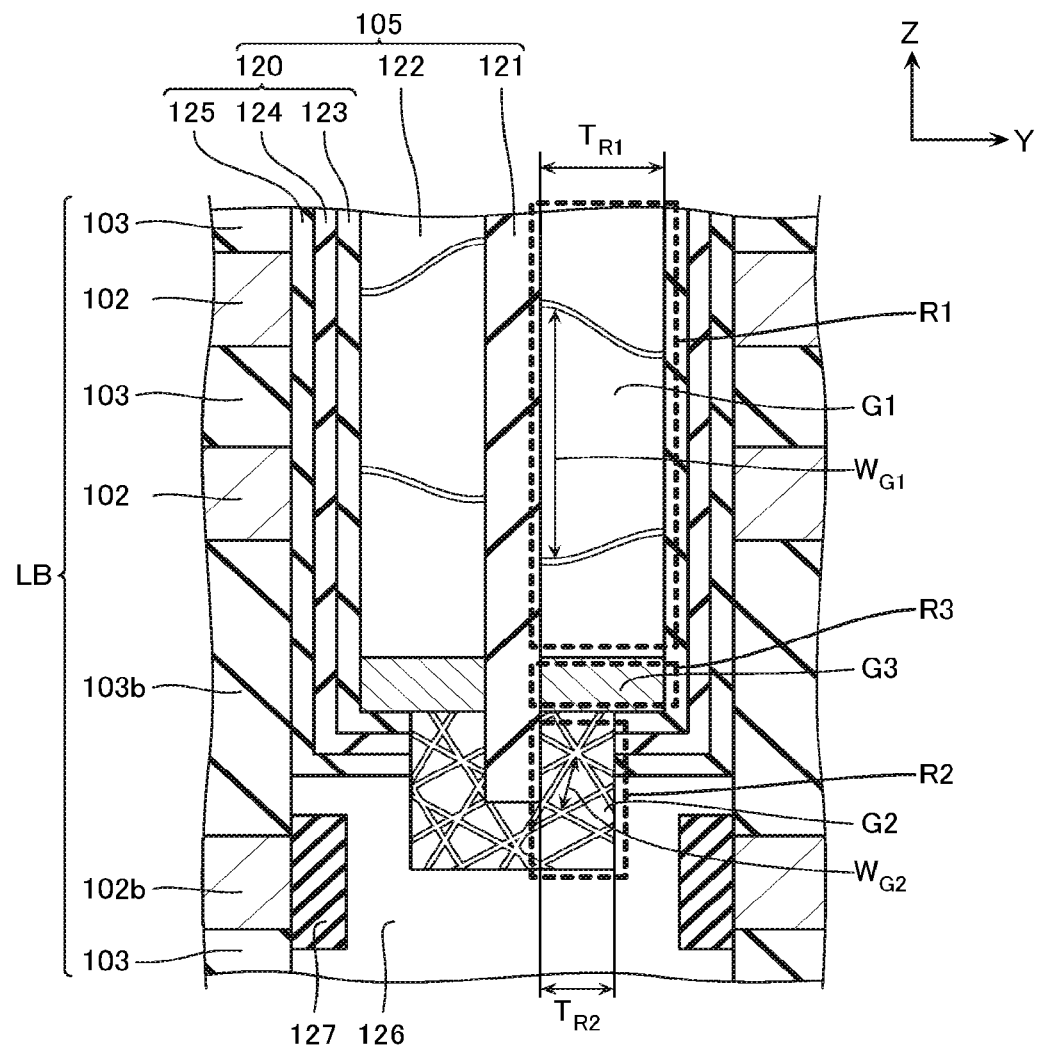
FIG. 7 is an enlarged view of part of FIG. 6.

FIG. 5 is a plan view showing a configuration of part of the same semiconductor memory device. FIG. 6 is a cross-sectional view showing a configuration of part of the same semiconductor memory device, and shows a cross section of a portion indicated by the line AA' of FIG. 5. FIG. 7 is an enlarged view of a portion indicated by A of FIG. 6. Note that FIGS. 5 to 7 do not show the likes of the conductive layer 106 or the conductive layer 107 described with reference to FIG. 3. Moreover, FIGS. 5 to 7 do show the likes of an inter-layer insulating layer 103 whose description was omitted in FIG. 3. Moreover, FIGS. 5 to 7 are shown for description, and a specific configuration may be appropriately changed.

As shown in FIG. 5, the semiconductor memory device according to the present embodiment comprises a plurality of the memory fingers MF and the conductive layers 108 arranged alternately in the Y direction. Moreover, a spacer insulating layer 112 is provided between the memory finger MF and the conductive layer 108. The memory finger MF, the conductive layer 108, and the spacer insulating layer 112 each extend in the X direction. The memory fingers MF each comprise a plurality of the memory columnar bodies 105 arranged staggered. The conductive layers 114 are respectively connected to these plurality of memory columnar bodies 105.

As shown in FIG. 6, the stacked body LB, in addition to including the plurality of conductive layers 102, includes also the inter-layer insulating layers 103 provided between these conductive layers 102. Moreover, the inter-layer insulating layer 103 (a second inter-layer insulating layer 103b) provided on an upper surface of the second conductive layer 102b is formed more thickly than the other inter-layer insulating layers 103. An upper surface of the stacked body LB is covered by an inter-layer insulating layer 142. The memory columnar body 105 extends in the Z direction penetrating the stacked body LB and the inter-layer insulating layer 142. Upper surfaces of the inter-layer insulating layer 142 and the memory columnar body 105 are covered by an inter-layer insulating layer 143. Moreover, side surfaces in the Y direction of the stacked body LB, the inter-layer insulating layer 142, and the inter-layer insulating layer 143 are covered by the spacer insulating layer 112. In addition, the conductive layer 108 extending in the Z direction is provided between a pair of the stacked bodies LB adjacent in the Y direction. Moreover, upper surfaces of the inter-layer insulating layer 143, the spacer insulating layer 112, and the conductive layer 108 are covered by an inter-layer insulating layer 144. The conductive layer 114 penetrates this inter-layer insulating layer 144 and the inter insulating layer 143 to contact an upper end of the memory columnar body 105. Note that the inter-layer insulting layers 103, 142, 143, and 144, and the spacer insulating layer 112 are configured from an insulating layer of the likes of silicon oxide ($SiO_2$), for example.

The second semiconductor layer 126 is provided at a lower end of the memory columnar body 105. A lower end of the second semiconductor layer 126 is embedded in the substrate 101. An upper end of the second semiconductor layer 126 is provided between an upper surface and a lower surface of the second inter-layer insulating layer 103b. An insulating layer 127 is provided between the second semiconductor layer 126 and the second conductive layer 102b. The second semiconductor layer 126 is configured from, for example, monocrystalline silicon whose orientation plane has been aligned with that of the substrate 101. The insulating layer 127 is configured from an insulating layer of the likes of silicon oxide ($SiO_2$), for example, and functions as a gate insulating layer of the lowermost layer source side select gate transistor.

The gate insulating layer 120 is provided on side surfaces of the plurality of conductive layers 102 and inter-layer insulating layers 103 in the stacked body LB. The gate insulating layer 120 covers, at its lower end, an upper surface of the second semiconductor layer 126. The lower end of the gate insulating layer 120 is provided between the upper surface and the lower surface of the second inter-layer insulating layer 103b.

The semiconductor layer 122 is provided on the side surface of the gate insulating layer 120. The semiconductor layer 122 comprises a first portion R1 and a second portion R2. The first portion R1 is a region functioning mainly as a channel body of the memory cell MC, and so on, extends in the Z direction, and faces the plurality of conductive layers 102 via the gate insulating layer 120. The second portion R2 is a portion electrically connecting this first portion R1 and the second semiconductor layer 126, and is provided on a closer side to the substrate 101 than the first portion R1, for example, at the lower end (the end closest to the substrate 101) of the semiconductor layer 122. A lower end of the first portion R1 and an upper end of the second portion R2 are provided between the upper surface and the lower surface of the second inter-layer insulating layer 103b.

The core insulating layer 121 is provided on the side surface of the semiconductor layer 122. The core insulating layer 121 is configured from an insulating layer of the likes of silicon oxide ($SiO_2$), for example.

Now, as shown in FIG. 7, in the present embodiment, a film thickness $T_{R1}$ of the first portion R1 of the semiconductor layer 122 in the Y direction is larger than a film thickness $T_{R2}$ of the second portion R2 of the semiconductor layer 122 in the Y direction. That is, a film thickness difference is provided between the first portion R1 and the second portion R2. In addition, a level difference is provided on a side surface of the semiconductor layer 122 between the first portion R1 and the second portion R2.

Moreover, a width $W_{G1}$ of a crystal grain G1 included in the first portion R1 is larger than a width $W_{G2}$ of a crystal grain G2 included in the second portion R2. The first portion R1 includes the crystal grain G1 having the width $W_{G1}$ larger than the film thickness $T_{R1}$. In the example shown in FIG. 7, the width $W_{G1}$ of the crystal grain G1 included in the first portion R1 is larger than the film thickness $T_{R1}$. In contrast, the second portion R2 does not include a crystal grain having a width larger than the film thickness $T_{R2}$. In other words, the width $W_{G2}$ of the crystal grain G2 included in the second portion R2 is smaller than the film thickness $T_{R2}$.

Note that "width" of a crystal grain referred to herein is assumed to mean a maximum value when the width has been measured from a plurality of directions for the crystal grain. Moreover, when a certain crystal grain is said to be larger or smaller than a film thickness, this is assumed to mean that the "width" of this crystal grain is larger or smaller than the film thickness.

Moreover, in the present embodiment, a third portion R3 is further provided between the first portion R1 and the second portion R2 of the semiconductor layer 122. The third portion R3 includes a metal atom of the likes of nickel (Ni), cobalt (Co), aluminum (Al), or palladium (Pd). In the example shown in FIG. 7, the third portion R3 includes a silicide layer G3. The silicide layer G3 is configured from a crystal of a disilicide such as nickel disilicide ($NiSi_2$), for example. Moreover, in the example shown in FIG. 7, a film thickness of the third portion R3 is about the same as the film thickness $T_{R1}$ of the first portion R1, and is larger than the film thickness $T_{R2}$ of the second portion R2.

[Method of Manufacturing]

FIGS. 8 to 22 are cross-sectional views for describing a method of manufacturing the semiconductor memory device according to the present embodiment, and are each a cross-sectional view corresponding to FIG. 6.

Figure 8:
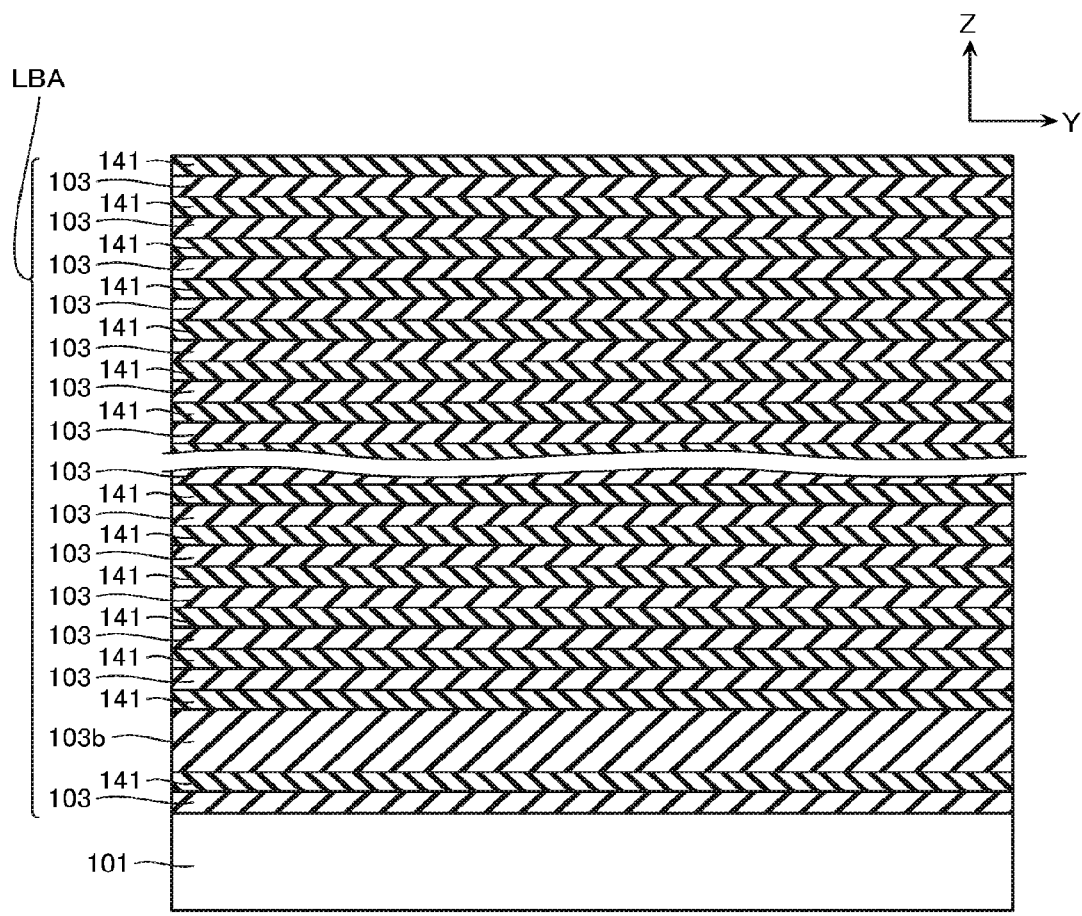
FIG. 8 is a cross-sectional view for describing a method of manufacturing the same semiconductor memory device.

As shown in FIG. 8, in the same method of manufacturing, a plurality of the inter-layer insulating layers 103 (including the second inter-layer insulating layer 103b) and sacrifice layers 141 are stacked alternately above the substrate 101 to form a stacked body LBA. The inter-layer insulating layer 103 is configured from an insulating layer of the likes of silicon oxide ($SiO_2$), for example. The sacrifice layer 141 is configured from the likes of silicon nitride ($Si_3N_4$), for example. Deposition of the inter-layer insulating layer 103 and the sacrifice layer 141 is performed by a method such as CVD (Chemical Vapor Deposition), for example.

Figure 9:
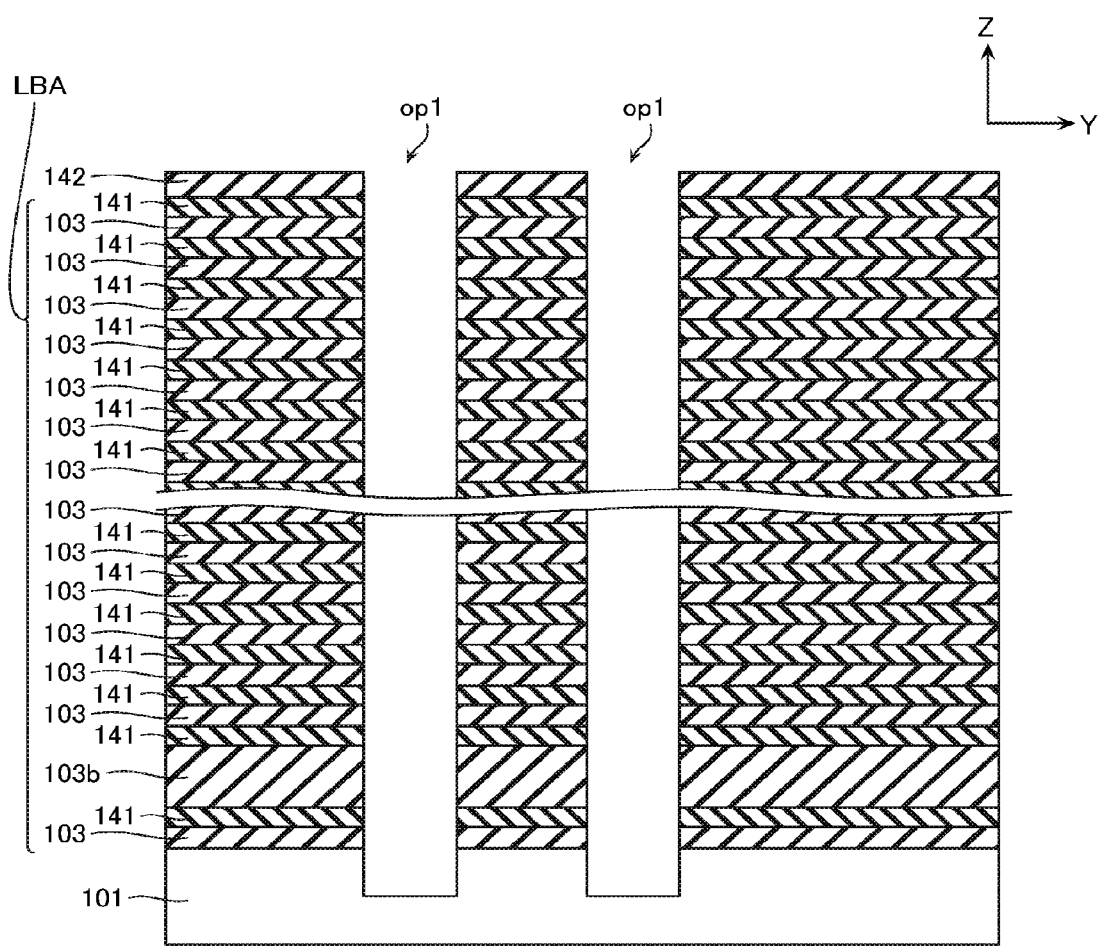
FIG. 9 is a cross-sectional view for describing the same method of manufacturing.

Next, as shown in FIG. 9, an opening op1 is formed in the stacked body LBA. The opening op1 is a through hole that extends in the Z direction and penetrates the plurality of inter-layer insulating layers 103 and sacrifice layers 141 stacked above the substrate 101, to expose an upper surface of the substrate 101. The opening op1 is formed by, for example, forming the inter-layer insulating layer 142 having an opening in a portion corresponding to the opening op1 above an upper surface of the stacked body LBA, and performing RIE (Reactive Ion Etching) using this inter-layer insulating layer 142 as a mask.

Figure 10:
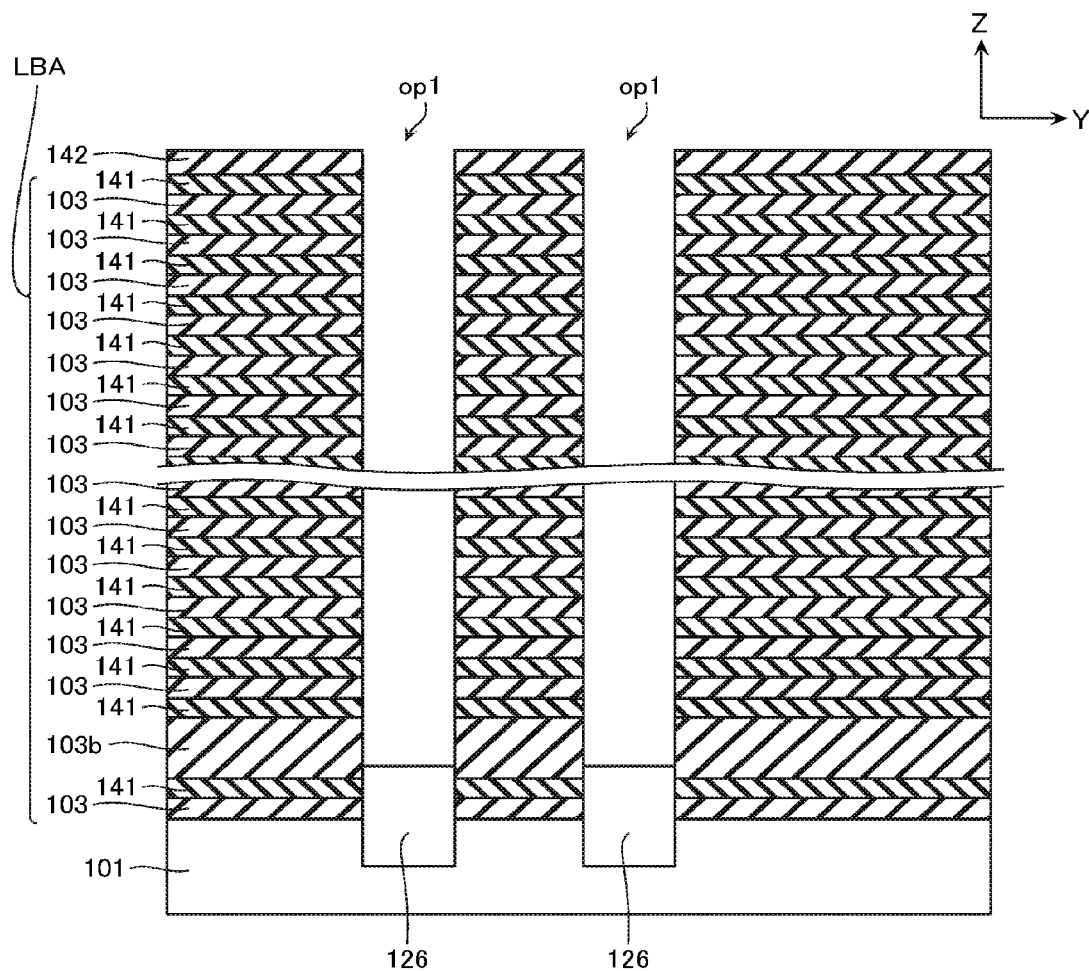
FIG. 10 is a cross-sectional view for describing the same method of manufacturing.

Next, as shown in FIG. 10, the second semiconductor layer 126 is formed on a bottom surface of the opening op1. The second semiconductor layer 126 is formed by a method such as an epitaxial growth method, for example. The second semiconductor layer 126 is formed such that a height of its upper surface is between those of the upper surface and the lower surface of the second inter-layer insulating layer 103b.

Figure 11:
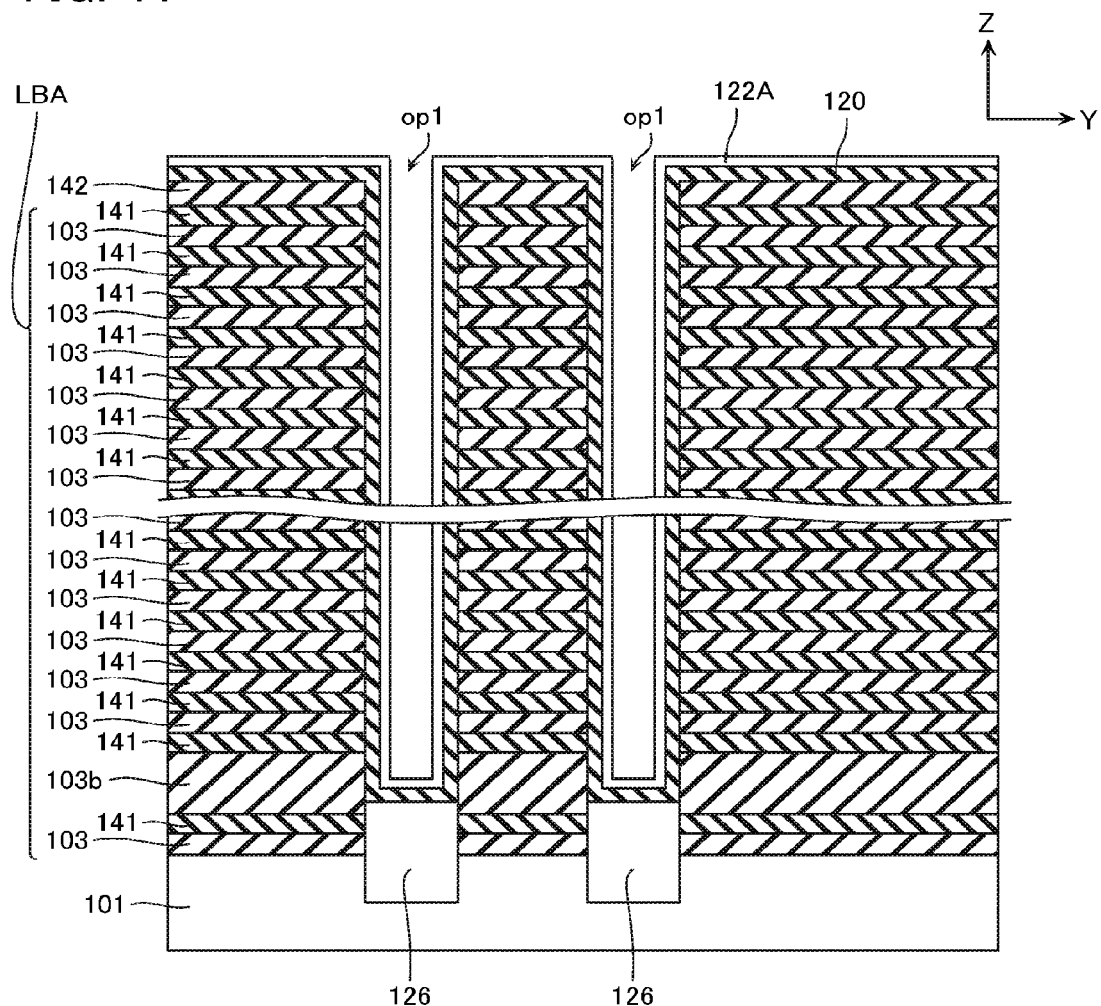
FIG. 11 is a cross-sectional view for describing the same method of manufacturing.

Next, as shown in FIG. 11, the gate insulating layer 120 and a semiconductor layer 122A are sequentially deposited on an upper surface of the second semiconductor layer 126, on a side surface of the stacked body LBA, and on an upper surface of the inter-layer insulating layer 142. The gate insulating layer 120 is configured from a stacked film of silicon oxide ($SiO_2$), silicon nitride ($Si_3N_4$), and silicon oxide ($SiO_2$), for example. The semiconductor layer 122A is configured from amorphous-state silicon (Si), for example. Note that deposition of the gate insulating layer 120 and the semiconductor layer 122A is performed by a method such as CVD, for example.

Figure 12:
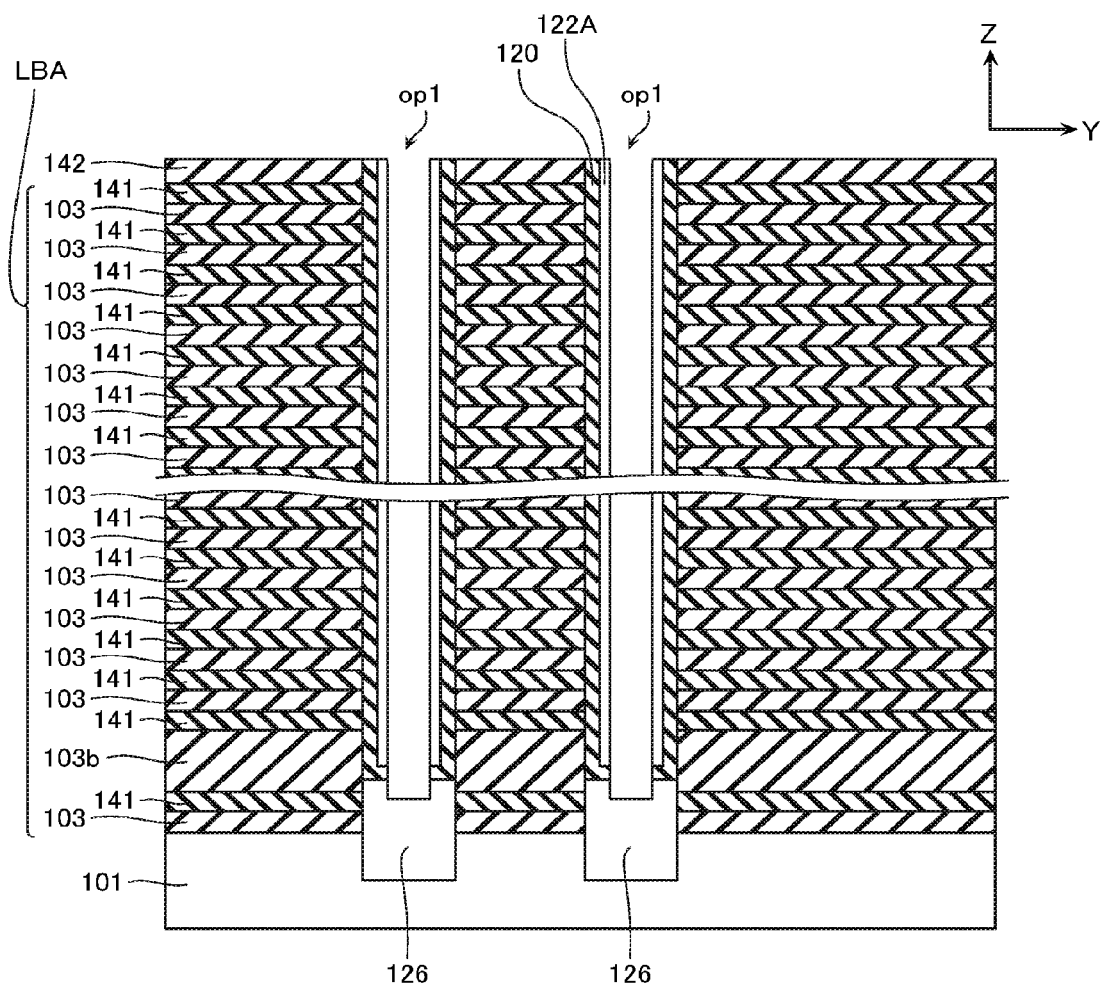
FIG. 12 is a cross-sectional view for describing the same method of manufacturing.

Next, as shown in FIG. 12, portions of the gate insulating layer 12Q and the semiconductor layer 122A covering the upper surface of the second semiconductor layer 126 and the upper surface of the inter-layer insulating layer 142 are removed. This step is performed by the likes of RIE, for example.

Figure 13:
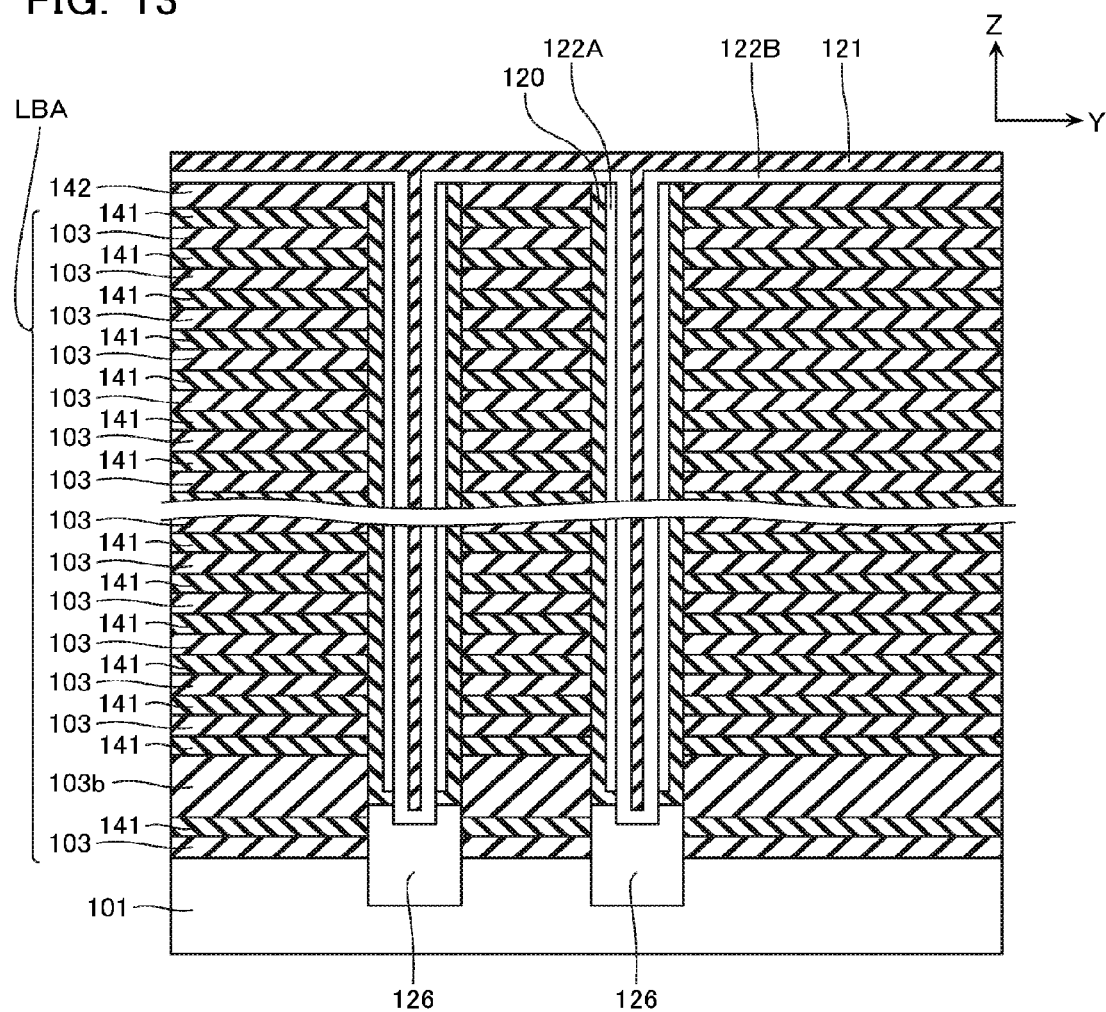
FIG. 13 is a cross-sectional view for describing the same method of manufacturing.

Next, as shown in FIG. 13, a semiconductor layer 122B is deposited on the upper surface of the second semiconductor layer 126, on a side surface of the semiconductor layer 122A, and on the upper surface of the inter-layer insulating layer 142, and the core insulating layer 121 is embedded. Deposition of the semiconductor layer 122B is performed by, for example, depositing amorphous-state silicon (Si) by a method such as CVD. The core insulating layer 121 is formed by filling the inside of the opening op1 with a liquid material and solidifying this liquid material by heat treatment.

Figure 14:
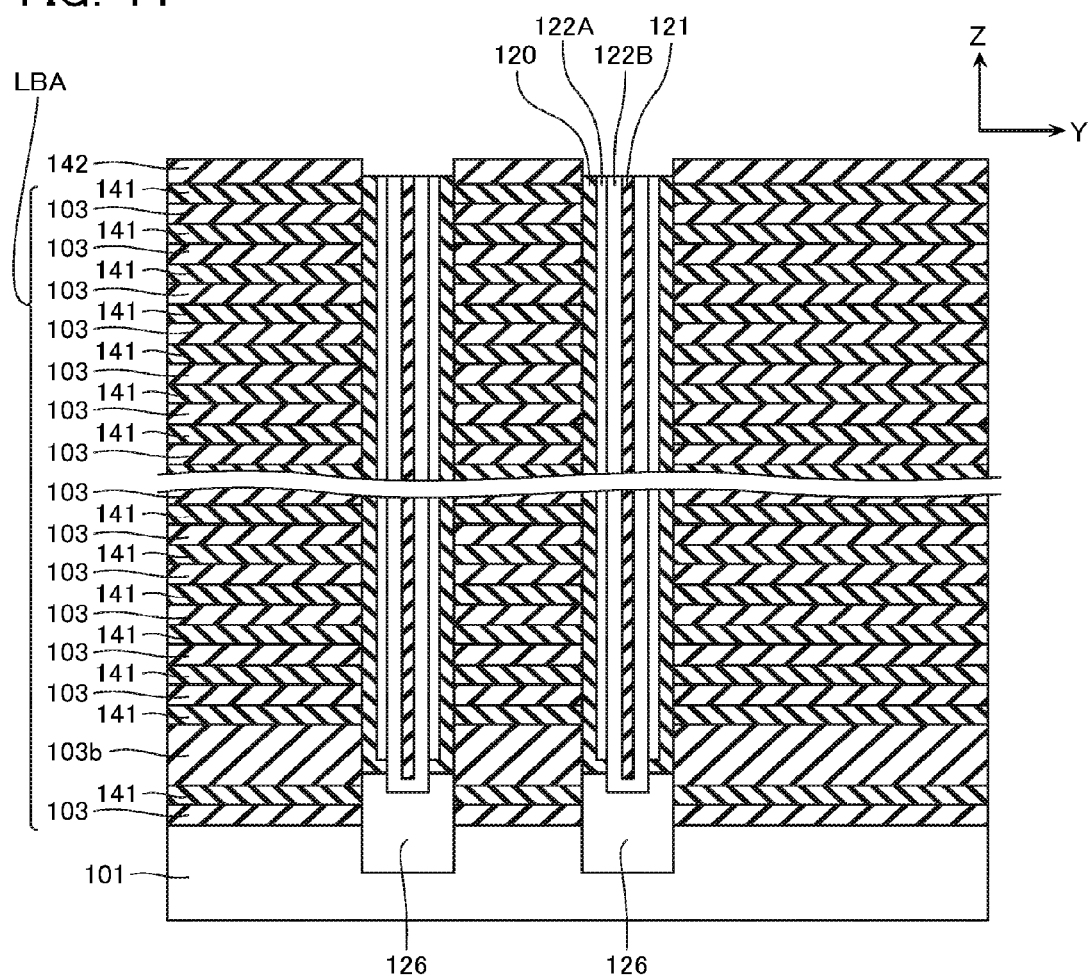
FIG. 14 is a cross-sectional view for describing the same method of manufacturing.

Next, as shown in FIG. 14, portions of the semiconductor layer 122B and the core insulating layer 121 covering the upper surface of the inter-layer insulating layer 142 are removed. This step is performed by the likes of RIE, for example.

Figure 15:
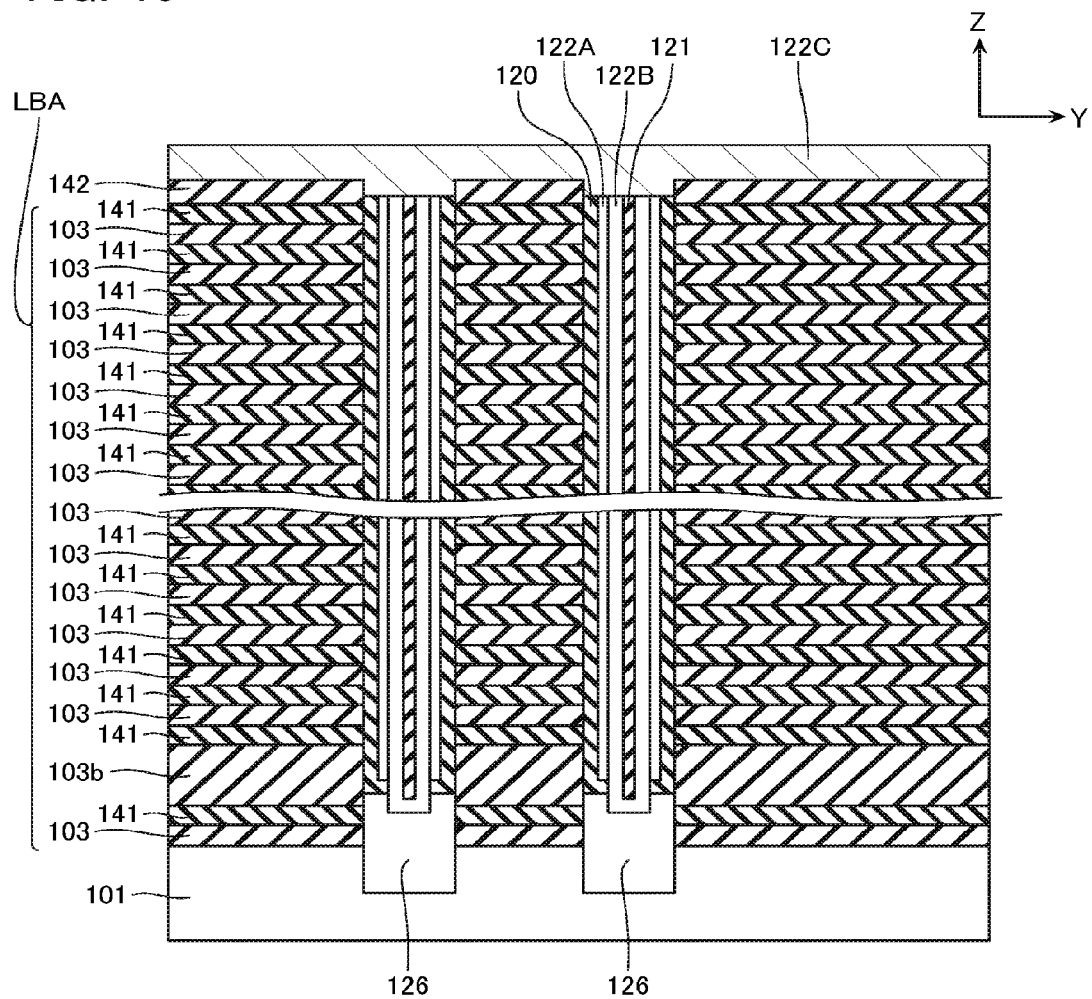
FIG. 15 is a cross-sectional view for describing the same method of manufacturing.

Next, as shown in FIG. 15, a metal layer 122O is deposited on upper surfaces of the core insulating layer 121, the semiconductor layer 122B, the semiconductor layer 122A, the gate insulating layer 120, and the inter-layer insulating layer 142. Deposition of the metal layer 122C is performed by PVD (Physical Vapor Deposition) such as sputtering, for example. The metal layer 122C is a layer of nickel (Ni), for example.

Figure 16:
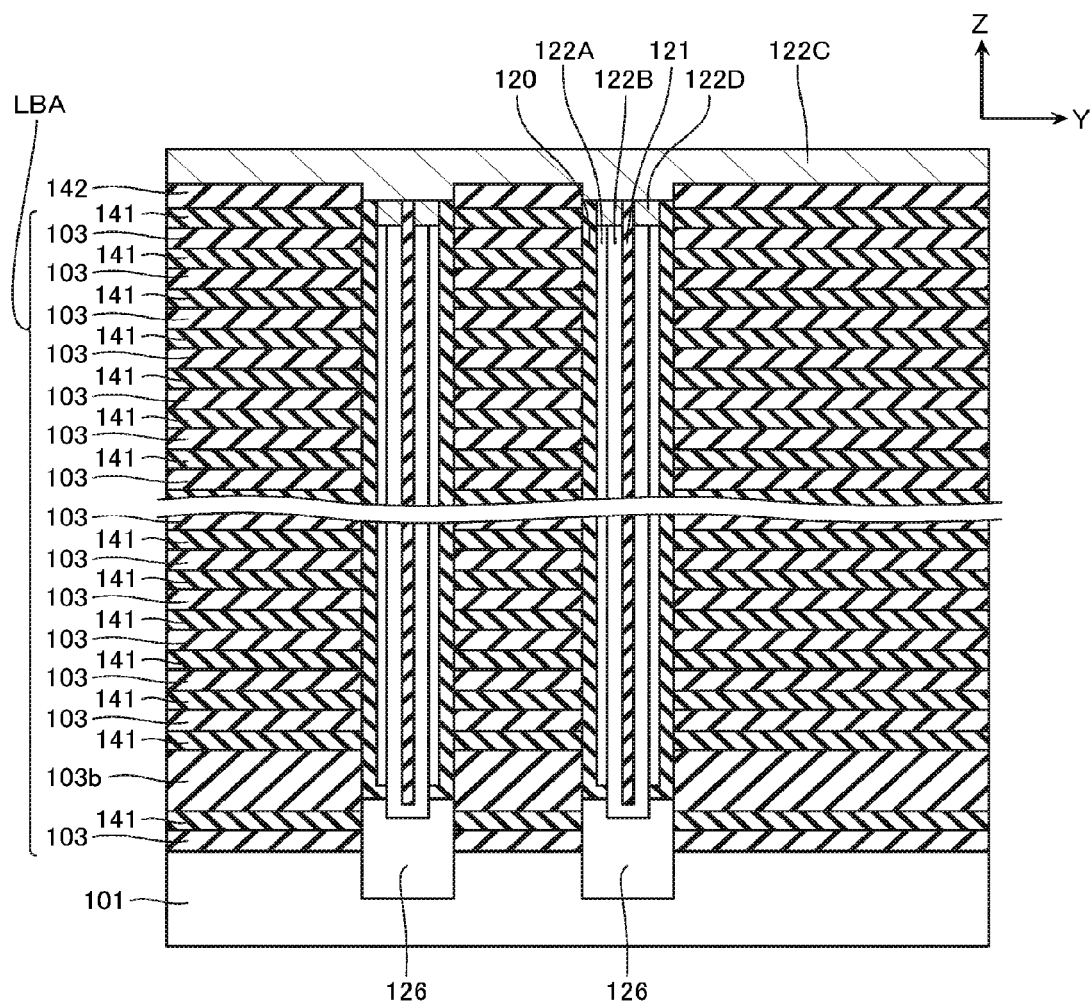
FIG. 16 is a cross-sectional view for describing the same method of manufacturing.

Next, as shown in FIG. 16, a silicide layer 122D is formed in upper ends of the semiconductor layer 122B and the semiconductor layer 122A. The silicide layer 122D is formed by the likes of heat treatment, for example. When heat treatment or the like is performed, metal atoms in the metal layer 122C diffuse in the semiconductor layer 122B and the semiconductor layer 122A to form a metal silicide. The silicide layer 122D is configured from nickel disilicide ($NiSi_2$), for example.

Figure 17:
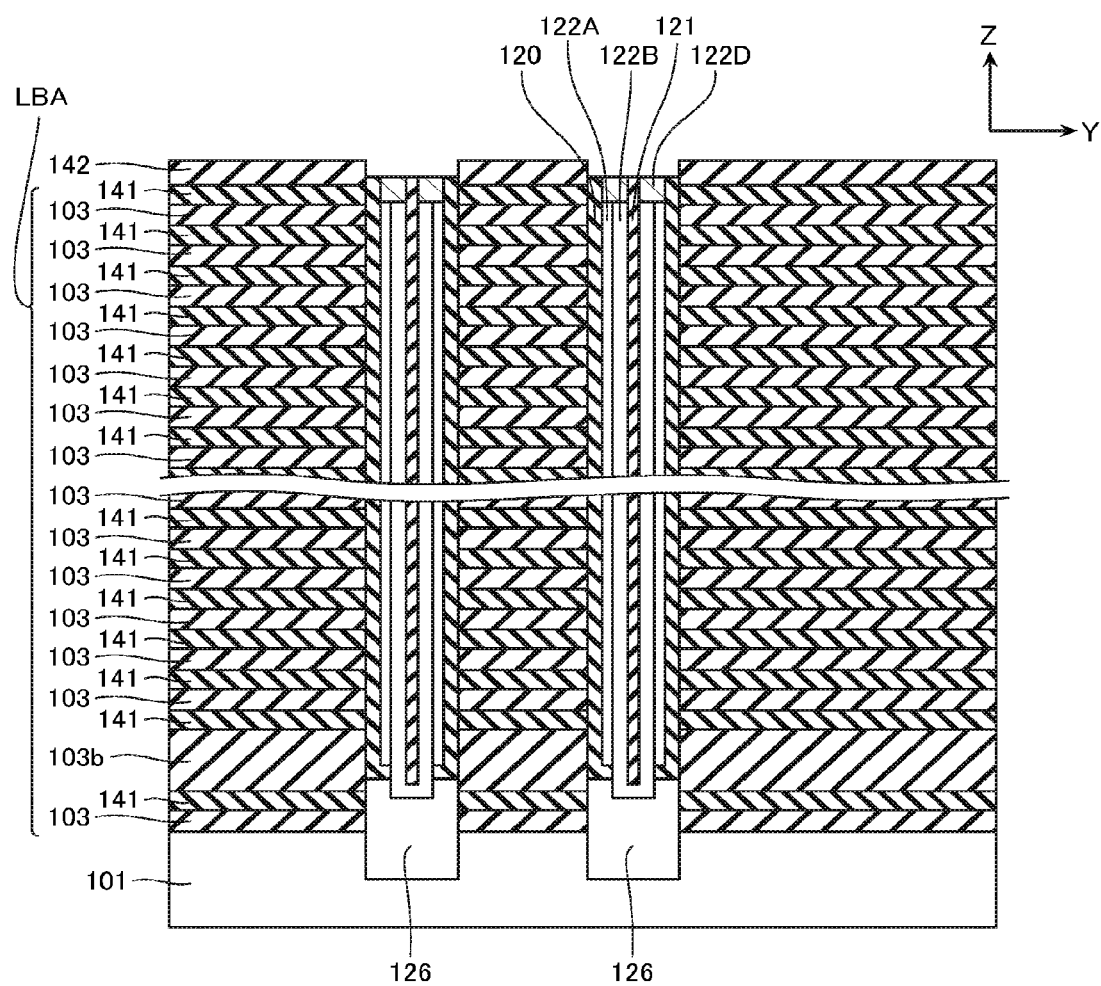
FIG. 17 is a cross-sectional view for describing the same method of manufacturing.

Next, as shown in FIG. 17, the metal layer 122C is removed by a means such as wet etching or dry etching.

Figure 18:
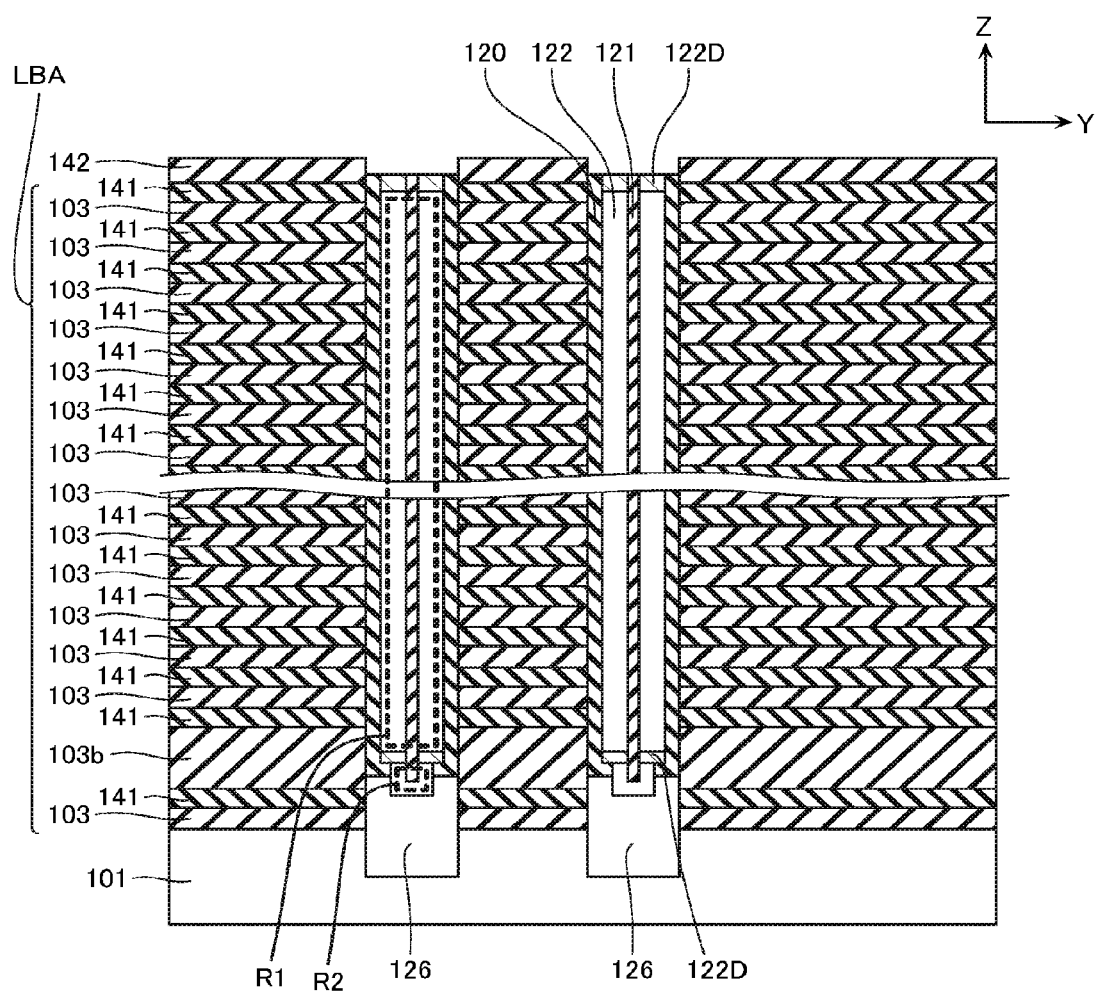
FIG. 18 is a cross-sectional view for describing the same method of manufacturing.

Next, as shown in FIG. 18, crystalline structures of the semiconductor layer 122B and the semiconductor layer 122A are reformed to form the semiconductor layer 122.

The first portion R1 of the semiconductor layer 122 is formed by an MILC (Metal Induced Lateral Crystallization) method. In the MILC method, heat treatment is performed. As a result, part of the silicide layer 122D passes through the amorphous-state semiconductor lay 122B and semiconductor layer 122A, thereby moving toward the substrate 101. Now, a lattice constant and crystalline structure of nickel disilicide are close to those of a monocrystal of silicon (Si). Therefore, in portions of the semiconductor layer 122B and the semiconductor layer 122A through which the silicide layer 122D has passed, the crystal grain G1 having the large width $W_{G1}$ of the kind described with reference to FIG. 7, is formed. Moreover, the silicide layer 122D that has moved to downward of the first portion R1 of the semiconductor layer 122 and the silicide layer 122D that has stayed upward become a silicide layer G3 of the kind described with reference to FIG. 7.

The second portion R2 of the semiconductor layer 122 is formed by the likes of heat treatment. As a result, the crystal grain G2 of the kind described with reference to FIG. 7 is formed.

Figure 19:
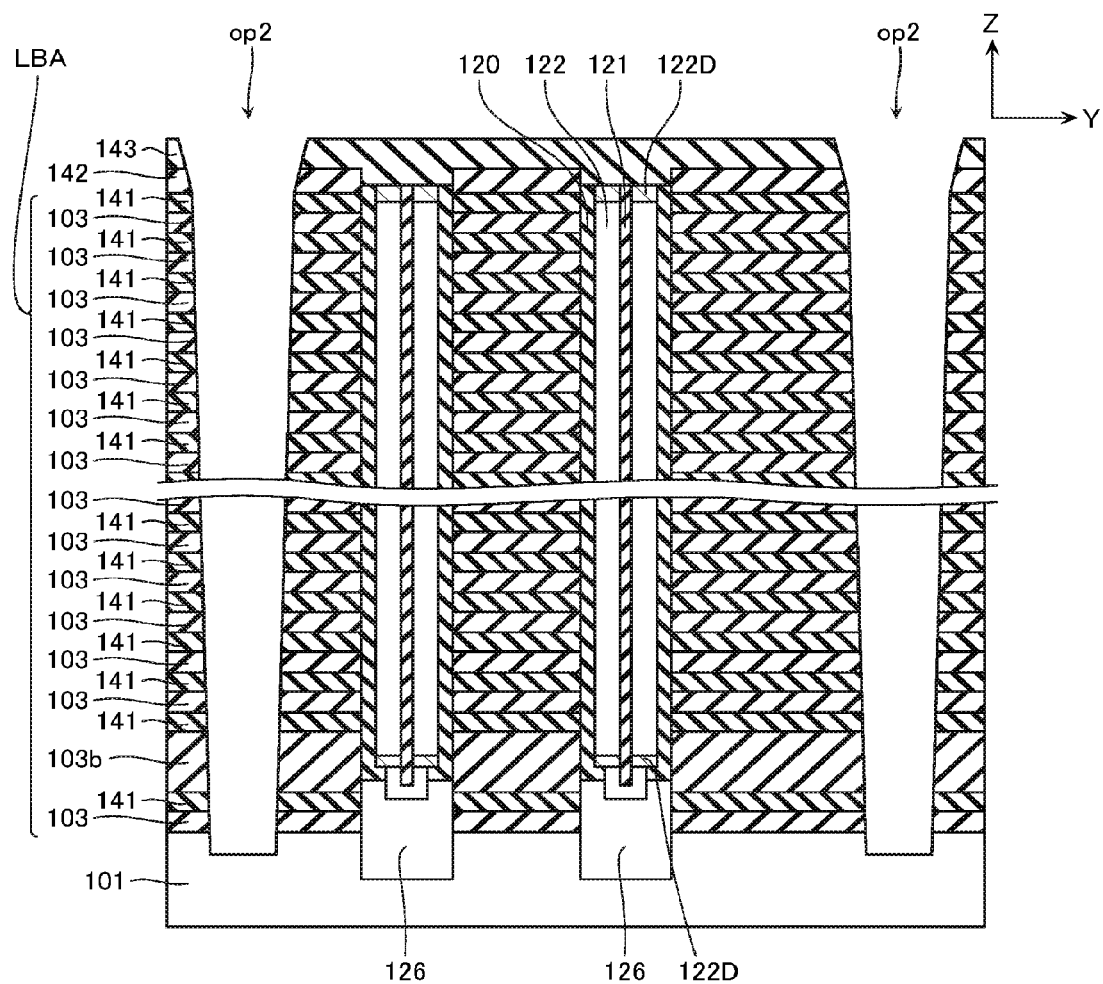
FIG. 19 is a cross-sectional view for describing the same method of manufacturing.

Next, as shown in FIG. 19, an opening op2 is formed in the stacked body LBA. The opening op2 is a trench that extends in the Z direction and the X direction, penetrates the plurality of inter-layer insulating layers 103 and sacrifice layers 141 stacked above the substrate 101, and divides the stacked body LBA in the Y direction to expose the upper surface of the substrate 101. The opening op2 is formed by, for example, forming the inter-layer insulating layer 143 having a trench in a portion corresponding to the opening op2 on the upper surface of the inter-layer insulating layer 142, and performing RIE using this inter-layer insulating layer 143 as a mask.

Figure 20:
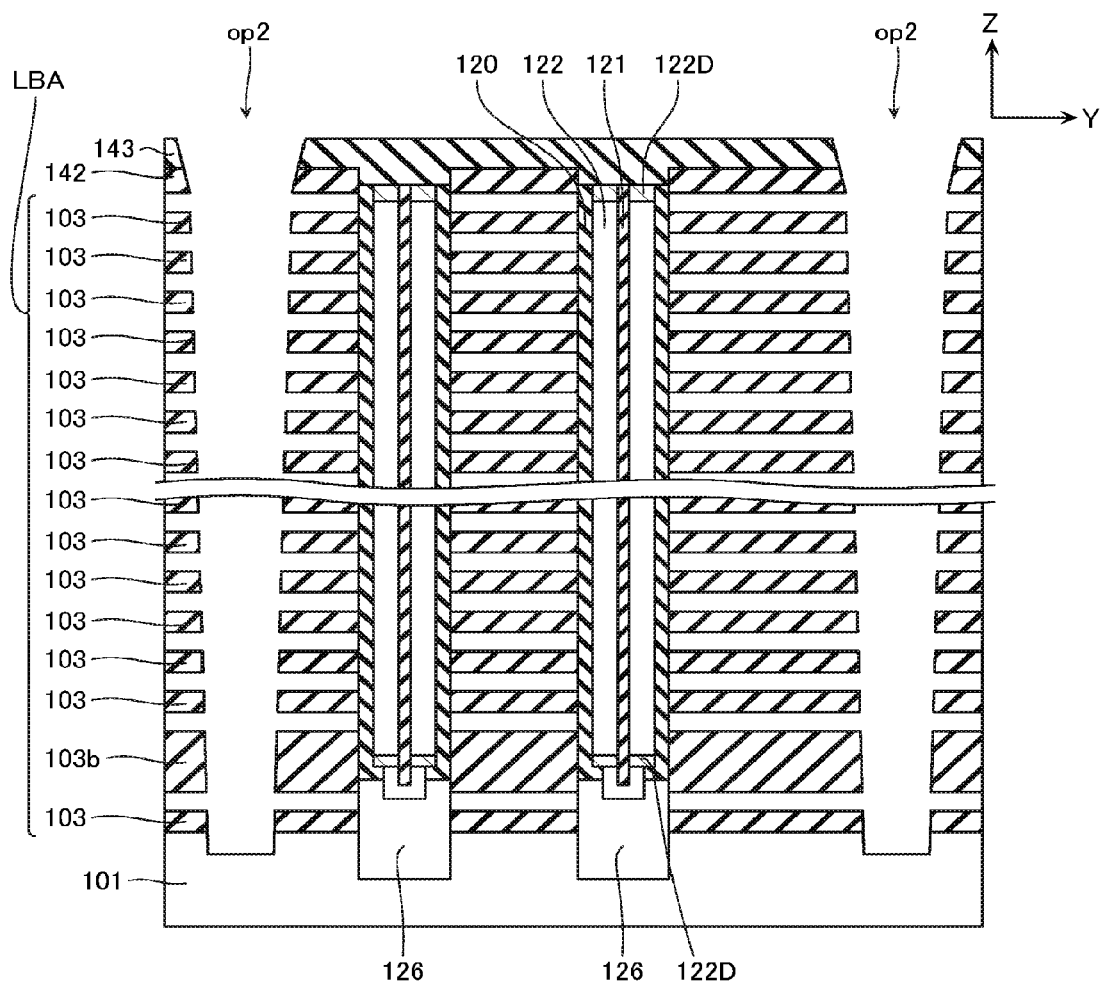
FIG. 20 is a cross-sectional view for describing the same method of manufacturing.

Next, as shown in FIG. 20, the sacrifice layer 141 is removed via the opening op2. The sacrifice layer 141 is removed by the likes of wet etching using phosphoric acid, for example.

Figure 21:
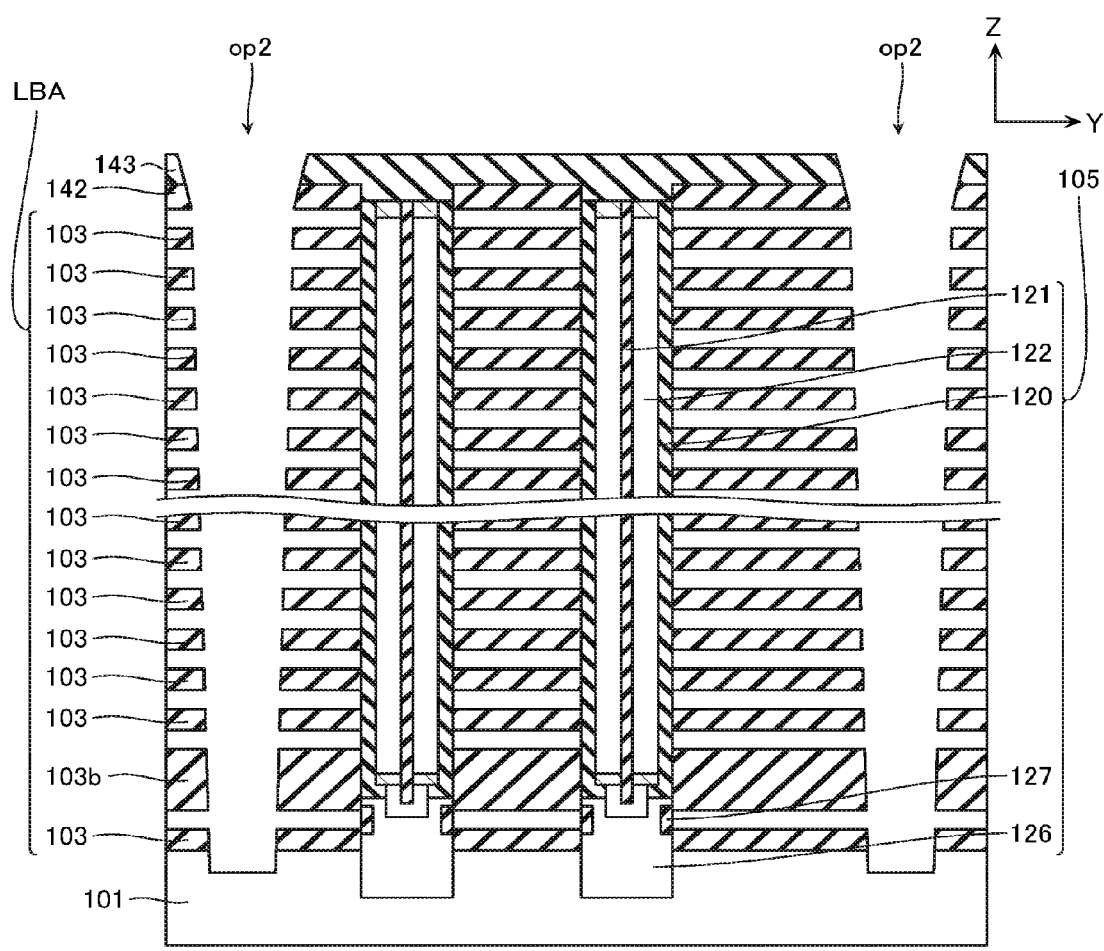
FIG. 21 is a cross-sectional view for describing the same method of manufacturing.

Next, as shown in FIG. 21, the insulating layer 127 is formed in a side surface of the second semiconductor layer 126. The insulating layer 127 is formed by, for example, performing oxidation treatment on the side surface of the second semiconductor layer 126 via the opening op2.

Figure 22:
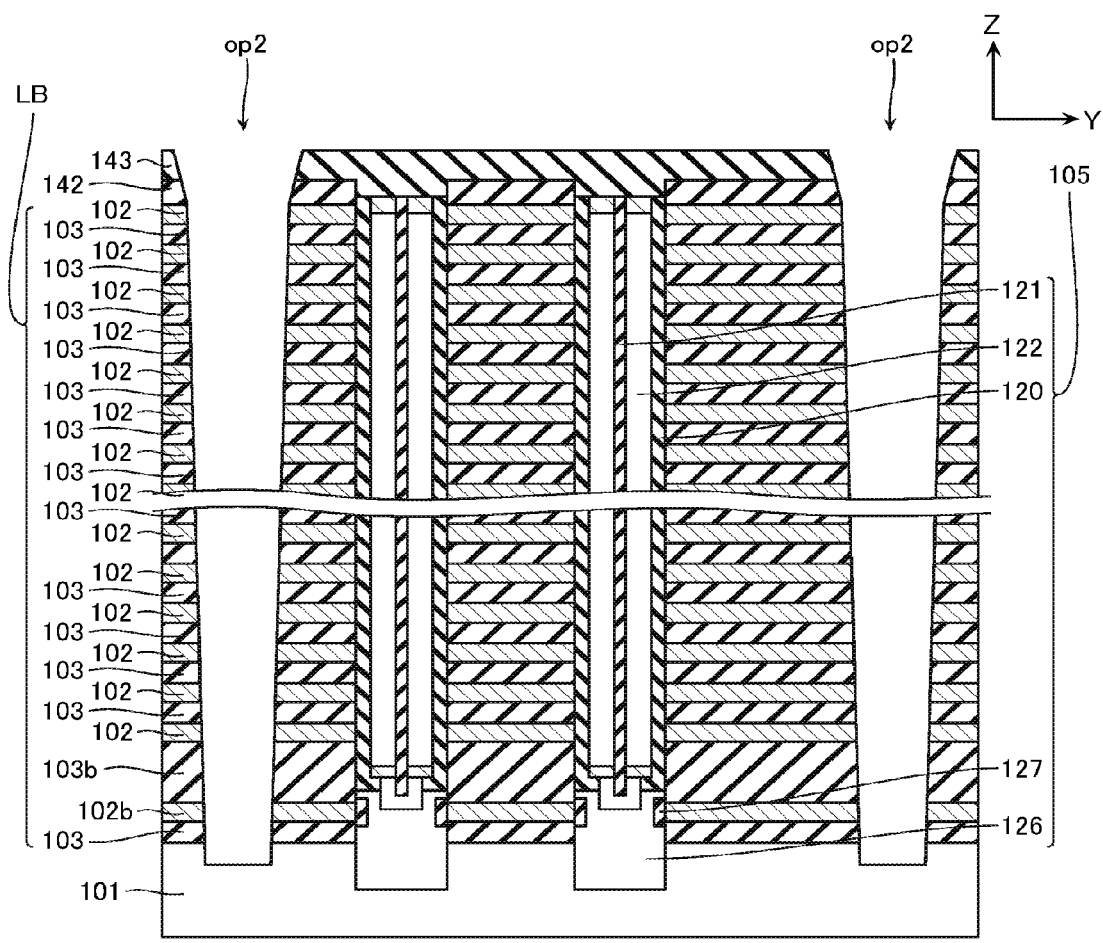
FIG. 22 is a cross-sectional view for describing the same method of manufacturing.

Next, as shown in FIG. 22, tune conductive layer 102 is formed. During formation of the conductive layer 102, for example, the conductive layer 102 is deposited on an upper surface, lower surface, and side surface of the inter-layer insulating layer 103 via the opening op2, and a portion formed on the side surface of the inter-layer insulating layer 103, of the conductive layer 102 is selectively removed. The conductive layer 102 is formed by, for example, depositing the likes of tungsten (W) by a means such as CVD.

Subsequently, as shown in FIG. 6, the spacer insulating layer 112 and the conductive layer 108 are formed between the stacked bodies LB adjacent in the Y direction, the inter-layer insulating layer 144 is deposited on upper surfaces of the conductive layer 108, the spacer insulating layer 112, and the inter-layer insulating layer 143, and the conductive layer 114 is formed, whereby the semiconductor memory device described with reference to FIGS. 5 to 7 is manufactured.

First Comparative Example

[Configuration]

Figure 23:
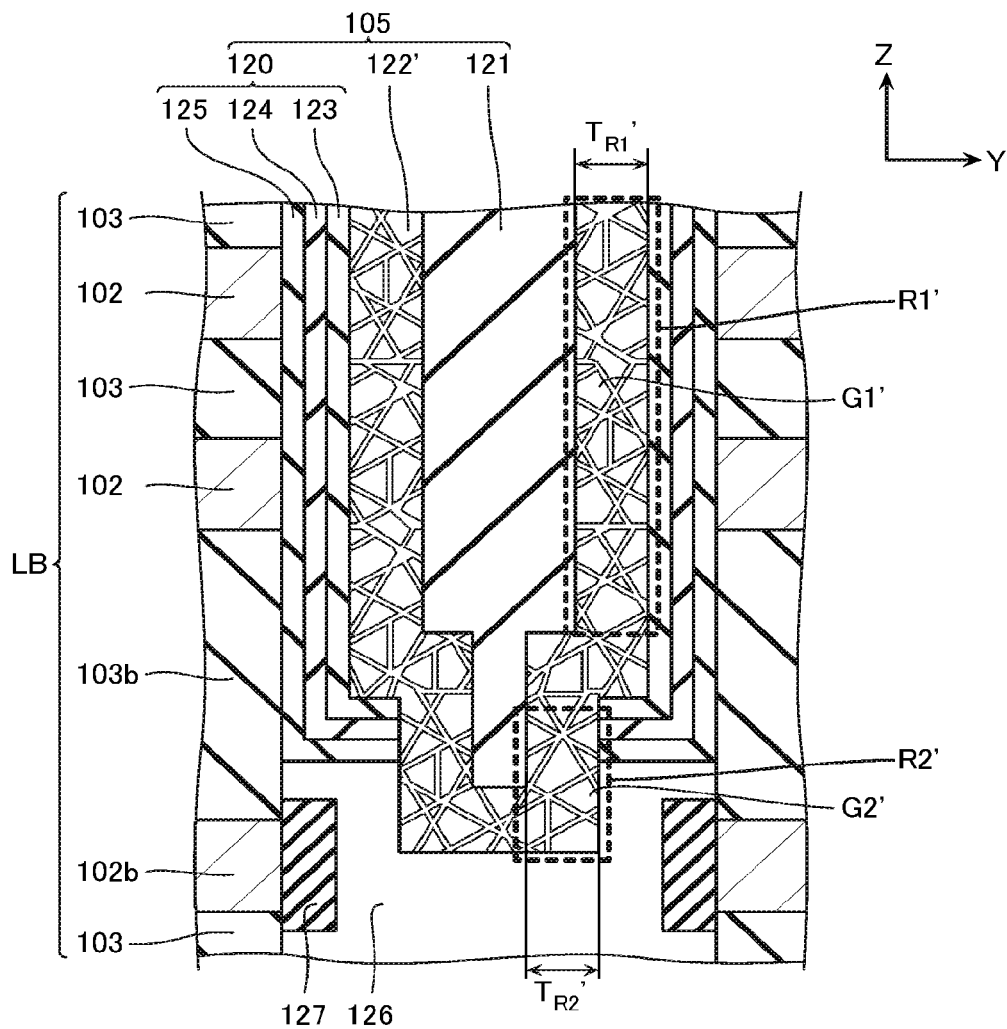
FIG. 23 is a cross-sectional view showing a configuration of part of a semiconductor memory device according to a first comparative example.

FIG. 23 is a cross-sectional view showing a configuration of a semiconductor memory device according to a first comparative example, and shows a portion corresponding to the portion shown in FIG. 7, of the semiconductor memory device according to the first embodiment.

The semiconductor memory device according to the first comparative example is basically configured similarly to the semiconductor memory device according to the first embodiment, but differs from the first embodiment in the following points.

As shown in FIG. 23, in the first comparative example, a film thickness $T_{R1}'$ in a first portion R1' of a semiconductor layer 122' is about the same as a film thickness $T_{R2}'$ in a second portion R2' of the semiconductor layer 122'.

Moreover, a crystal grain G1' included in the first portion R1' is about the same size as a crystal grain G2' included in the second portion R2'. These crystal grain G1' and crystal grain G2' are smaller than the film thickness $T_{R1}'$ or film thickness $T_{R2}'$.

In addition, the third portion including the metal atom of the likes of nickel is not provided between the first portion R1' and the second portion R2'.

[Method of Manufacturing]

When manufacturing the semiconductor memory device according to the first comparative example, first, the steps described with reference to FIGS. 8 to 12 are performed.

Figure 24:
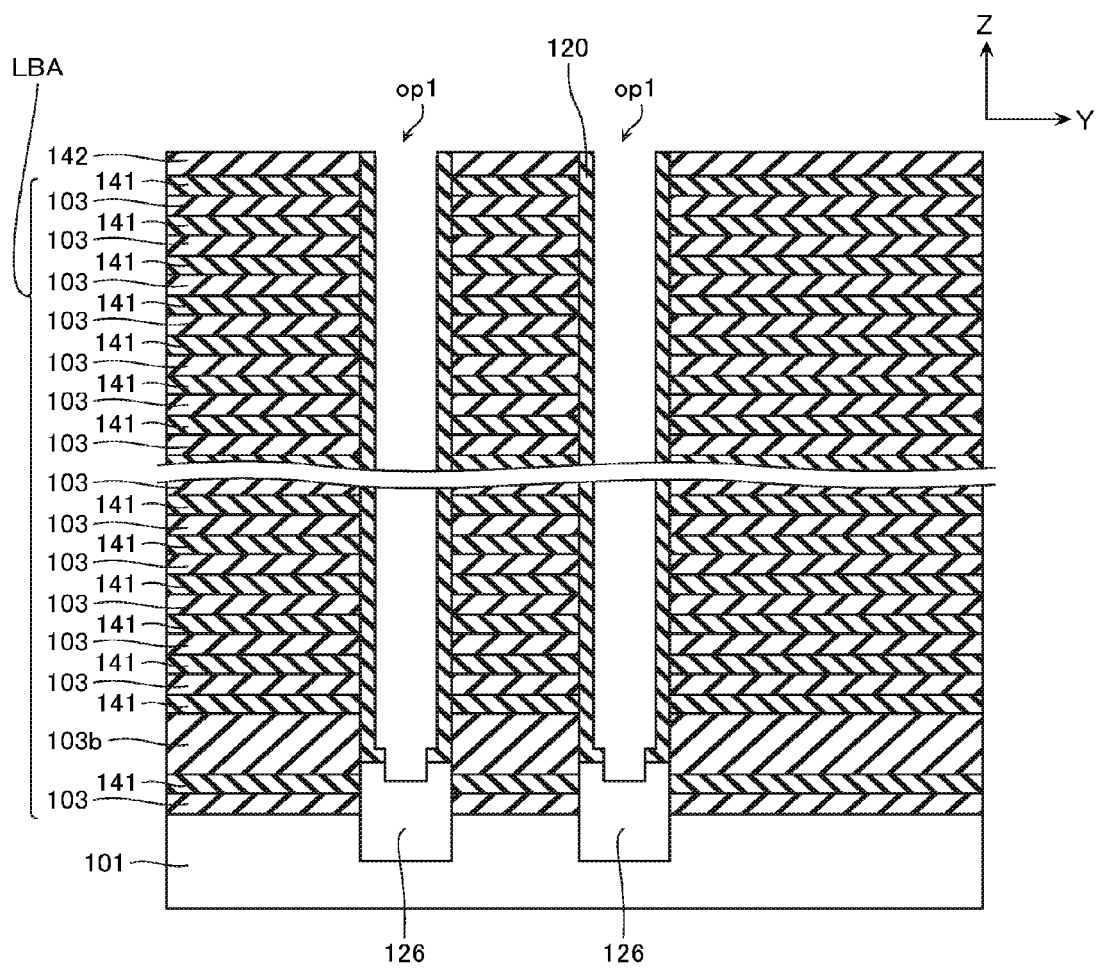
FIG. 24 is a cross-sectional view for describing a method of manufacturing the same semiconductor memory device.

Next, as shown in FIG. 24, the semiconductor layer 122A is removed. This step is performed by a means such as wet etching, for example.

Figure 25:
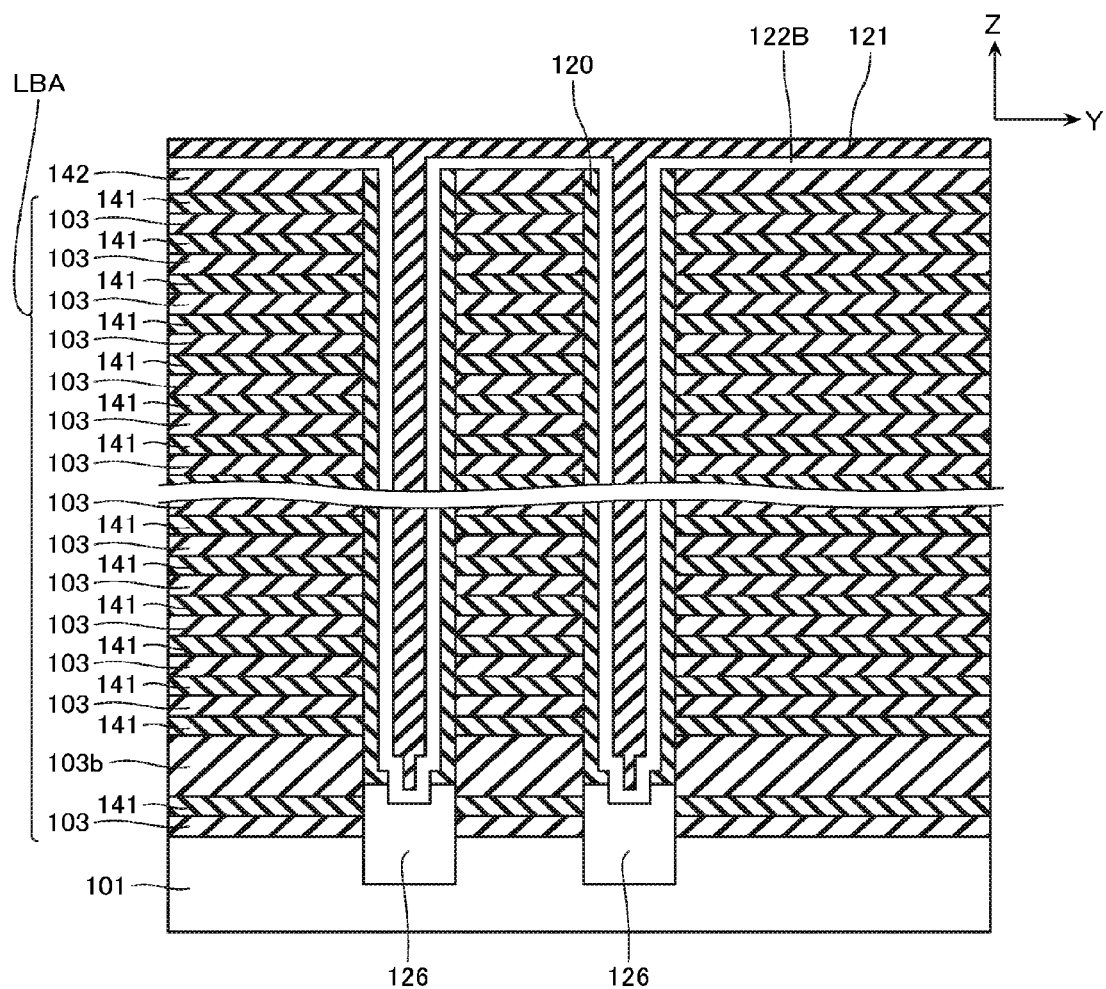
FIG. 25 is a cross-sectional view for describing the same method of manufacturing.

Next, as shown in FIG. 25, the semiconductor layer 122B is deposited on the upper surface of the second semiconductor layer 126, on a side surface of the gate insulating layer 120, and on the upper surface of the inter-layer insulating layer 142, and the core insulating layer 121 is embedded. This step is performed similarly to the step described with reference to FIG. 13.

Figure 26:
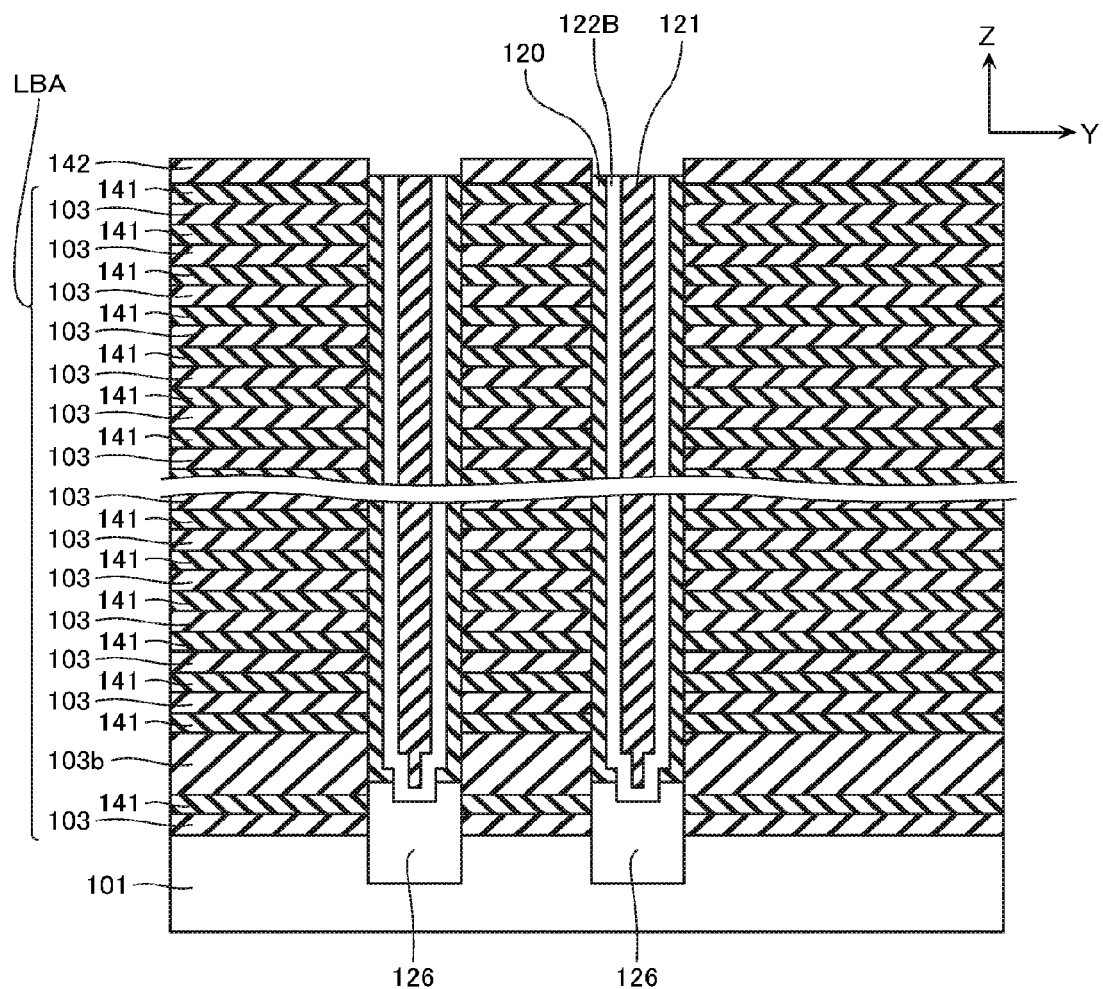
FIG. 26 is a cross-sectional view for describing the same method of manufacturing.

Next, as shown in FIG. 26, portions of the semiconductor layer 122B and the core insulating layer 121 covering the upper surface of the inter-layer insulating layer 142 are removed. This step is performed by the likes of RIE, for example.

Next, heat treatment or the like is performed and the crystalline structure of the semiconductor layer 122B is reformed to form the semiconductor layer 122'. Subsequently, steps from the step described with reference to FIG. 19 onward are performed, whereby the semiconductor memory device of the kind described with reference to FIG. 23 is manufactured.

Second Comparative Example

[Configuration]

Figure 27:
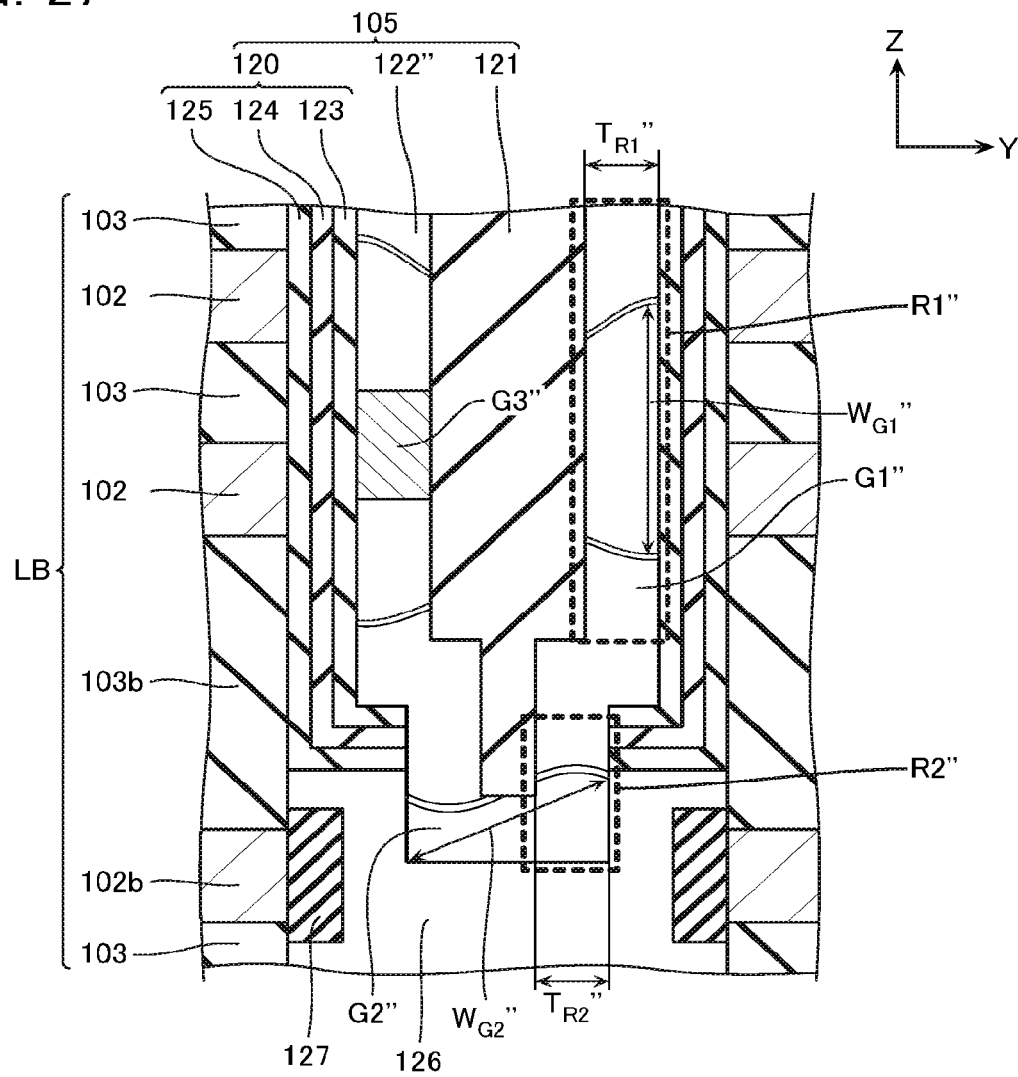
FIG. 27 is a cross-sectional view showing a configuration of part of a semiconductor memory device according to a second comparative example.

FIG. 27 is a cross-sectional view showing a configuration of a semiconductor memory device according to a second comparative example, and shows a portion corresponding to the portion shown in FIG. 7, of the semiconductor memory device according to the first embodiment.

The semiconductor memory device according to the second comparative example is basically configured similarly to the semiconductor memory device according to the first embodiment, but differs from the first embodiment in the following points.

As shown in FIG. 27, in the second comparative example, a film thickness $T_{R1}''$ in a first portion R1'' of a semiconductor layer 122'' is about the same as a film thickness $T_{R2}''$ in a second portion R2'' of the semiconductor layer 122''.

Moreover, a width $W_{G1}''$ of a crystal grain G1'' included in the first portion R1' is larger than the film thickness $T_{R1}''$ of the first portion R1'', and a width $W_{G2}''$ of a crystal grain G2'' included in the second portion R2'' is larger than the film thickness $T_{R2}''$ of the second portion R2''.

In addition, the third portion including the metal atom of the likes of nickel is not provided between the first portion R1'' and the second portion R2''. On the other hand, a silicide layer G3'' is included in the first portion R1''.

[Method of Manufacturing]

When manufacturing the semiconductor memory device according to the second comparative example, first, the steps described with reference to FIGS. 8 to 12 are performed similarly to in the first embodiment, and next, the steps described with reference to FIGS. 24 to 26 are performed similarly to in the first comparative example.

Figure 28:
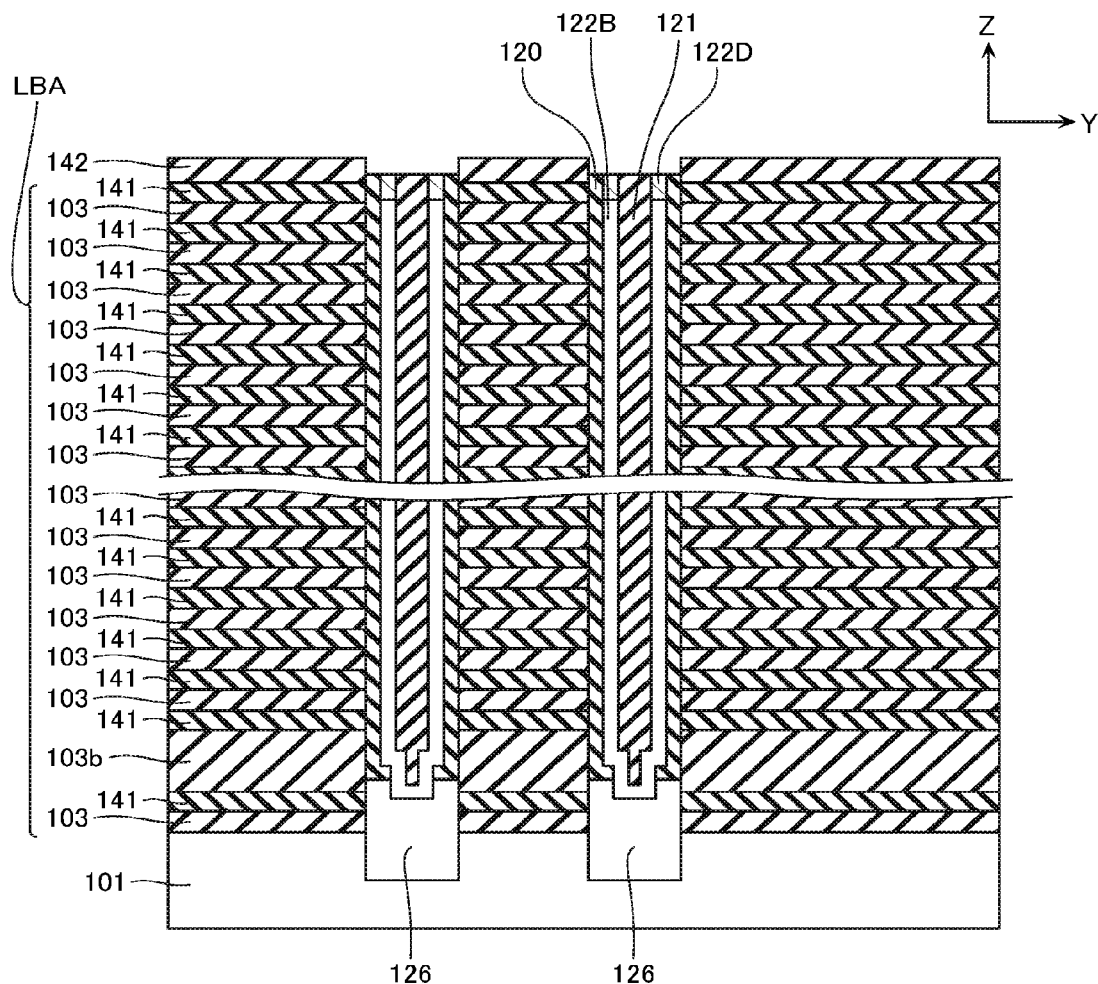
FIG. 28 is a cross-sectional view for describing a method of manufacturing the same semiconductor memory device.

Next, as shown in FIG. 28, the silicide layer 122D is formed in an upper end of the semiconductor layer 122B. Formation of the silicide layer 122D is performed by, for example, deposition of a metal layer, heat treatment, and removal of the metal layer, similarly to in the steps described with reference to FIGS. 15 to 17.

Figure 29:
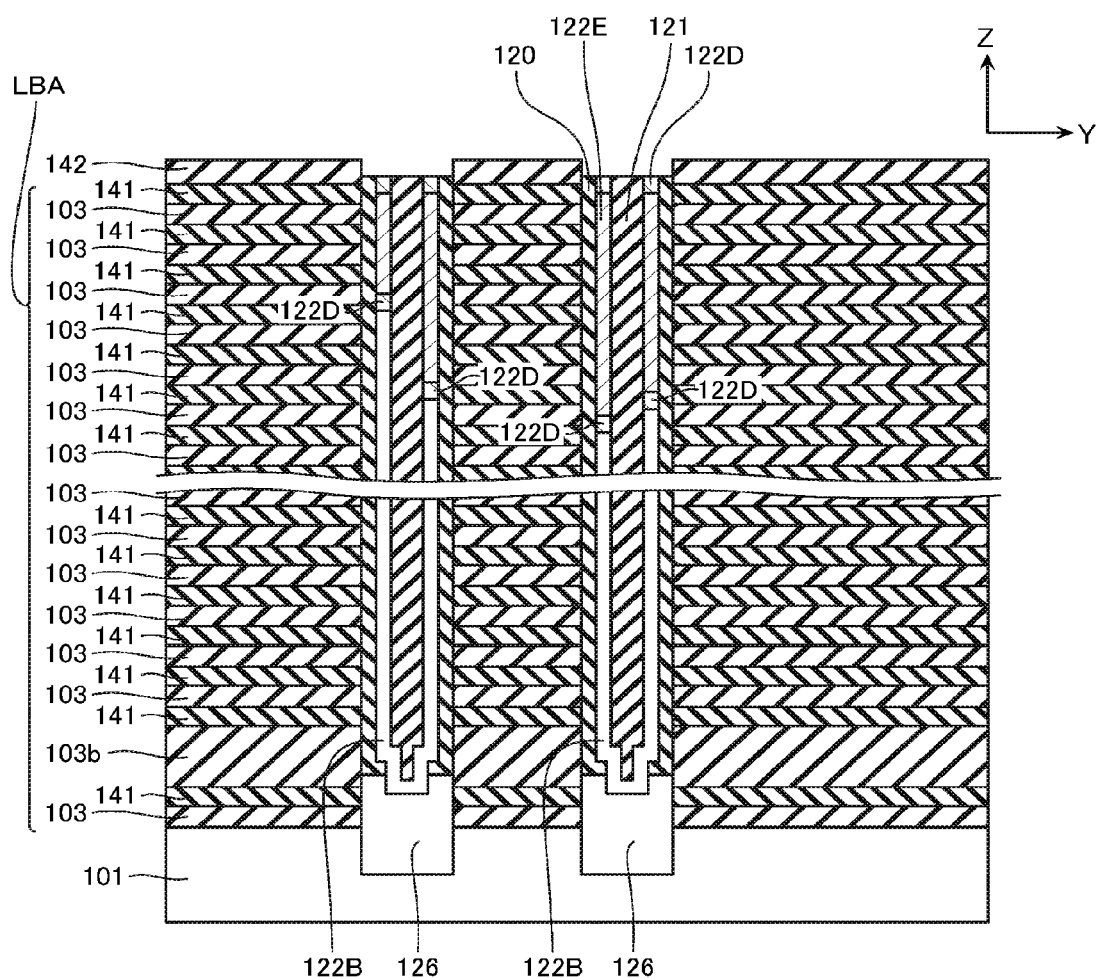
FIG. 29 is a cross-sectional view for describing the same method of manufacturing.

Next, as shown in FIG. 29, the crystalline structure of the semiconductor layer 122B is reformed by the MILC method. FIG. 29 shows how crystallization of the semiconductor layer 122B progresses by the MILC method. Note that in FIG. 29, for description, an amorphous-state portion (122B) is shown in white, and a crystallized portion (122E) is shown by oblique lines.

Subsequently, steps from the step described with reference to FIG. 19 onward are performed, whereby the semiconductor memory device of the kind described with reference to FIG. 27 is manufactured.

[Advantages of Semiconductor Memory Device According to First Embodiment]

Advantages of the semiconductor memory device according to the first embodiment will be described by comparing the semiconductor memory device according to the first embodiment and the semiconductor memory devices according to the first comparative example and the second comparative example.

In the first comparative example described with reference to FIG. 23, the crystalline structure of the semiconductor layer 122' is reformed by heat treatment only. Therefore, there is a tendency for the crystal grains G1' and G2' included in the first portion R1' and the second portion R2' to end up becoming small. When the crystal grain included in the semiconductor layer 122' is small, the number of grain boundaries ends up increasing, and a voltage drop in the semiconductor layer 122' ends up increasing.

In the second comparative example described with reference to FIG. 27, the crystalline structure of the semiconductor layer 122" is reformed by the MILC method. Therefore, the crystal grains G1" and G2" included in the first portion R1" and the second portion R2" can be made larger than in the first comparative example. Therefore, in the second comparative example, a voltage drop in the semiconductor layer 122" can be decreased more than in the first comparative example.

Figure 30:
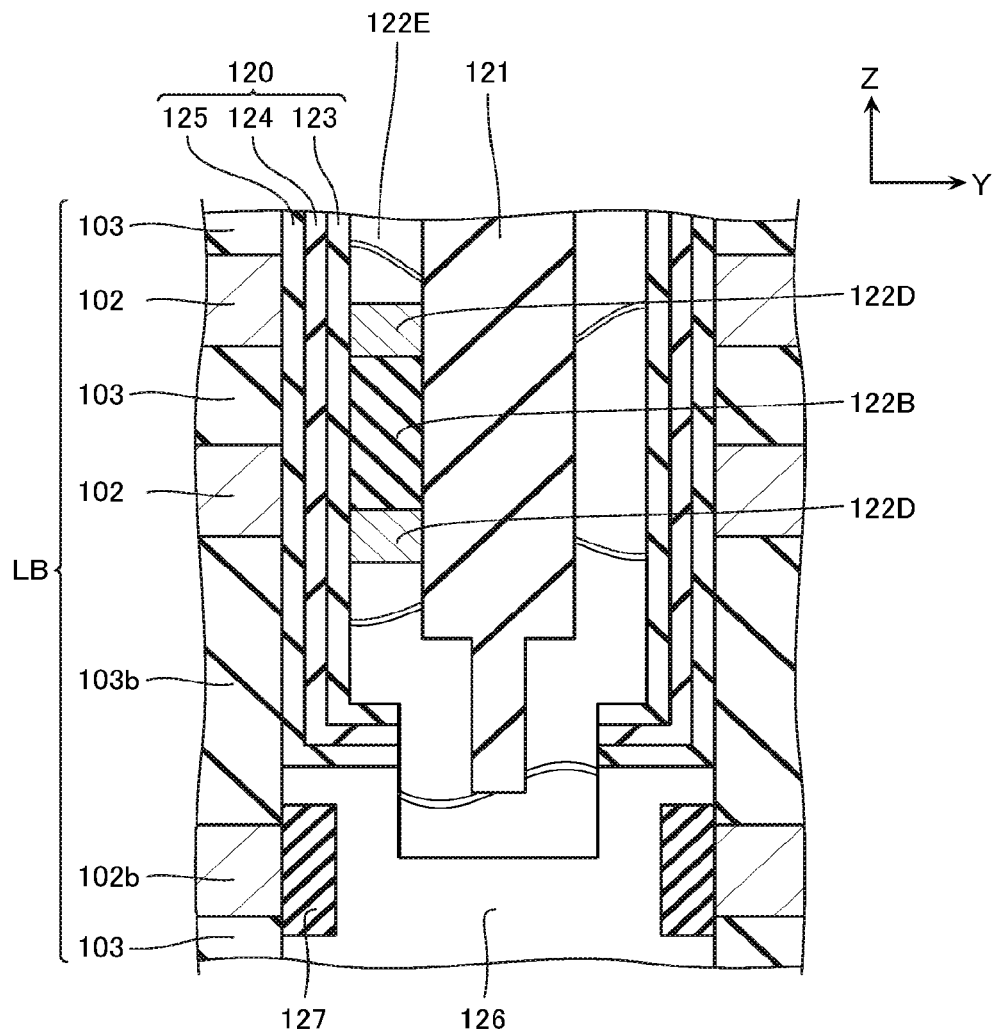
FIG. 30 is a cross-sectional view for describing the same method of manufacturing.

However, in the MILC method, a speed at which the silicide layer 122D progresses (a speed at which crystallization progresses) is not uniform. Therefore, although, as shown in FIG. 28, the silicide layer 122D has a substantially annular shape in a state immediately after being formed in the upper end of the cylindrical semiconductor layer 122B, when, as shown in FIG. 29, crystallization progresses, a shape of the silicide layer 122D begins to deform. As shown in FIG. 30, when crystallization further progresses, part of the silicide layer 122D reaches a lower end of the semiconductor layer 122B and next progresses upwardly.

As a result, as described with reference to FIG. 27, in the second comparative example, the silicide layer G3" is sometimes included in the first portion R1" of the semiconductor layer 122". As a result, it sometimes becomes impossible for the likes of the memory cell MC or the source side select gate transistor STS to be set to an OFF state.

Now, as a result of study of the inventors, it was found that the speed at which the silicide layer 122D progresses (the speed at which crystallization progresses) in the MILC method depends on the film thickness of the semiconductor layer. That is, it was found that in the MILC method, the larger the film thickness of the semiconductor layer is, the faster the silicide layer 122D progresses, and the smaller the film thickness of the semiconductor layer is, the slower the silicide layer 122D progresses.

Accordingly, in the first embodiment, as described with reference to FIGS. 11 to 14, by depositing the semiconductor layer 122A and the semiconductor layer 122B divided into two stages, a semiconductor layer whose film thickness is small at its lower end side and whose film thickness is large at its upper end side, is formed. Next, as described with reference to FIGS. 15 to 17, the silicide layer 122D is formed in the upper end of this semiconductor layer, and as shown in FIG. 18, the MILC method is performed in this state. As a result, as shown in FIG. 18, progress of the silicide layer 122D can be suppressed at a level difference portion (a portion between the first portion R1 and the second portion R2) of the semiconductor layer.

As a result, as described with reference to FIG. 7, in the first embodiment, the width $W_{G1}$ of the crystal grain G1 included in the first portion R1 can be made larger than in the first comparative example. As a result, a voltage drop in the semiconductor layer 122 can be reduced.

Moreover, by providing a difference between the film thickness $T_{R1}$ of the first portion R1 and the film thickness $T_{R2}$ of the second portion R2 of the semiconductor layer 122, it becomes possible to keep the silicide layer G3 between the first portion R1 and the second portion R2 and to prevent that it becomes impossible for the likes of the memory cell MC or the source side select gate transistor STS to be set to an OFF state. Moreover, by making uniform a film quality in the first portion R1 of the semiconductor layer 122, variation in characteristics of the likes of the memory cell MC or the source side select gate transistor STS can be reduced.

Figure 31:
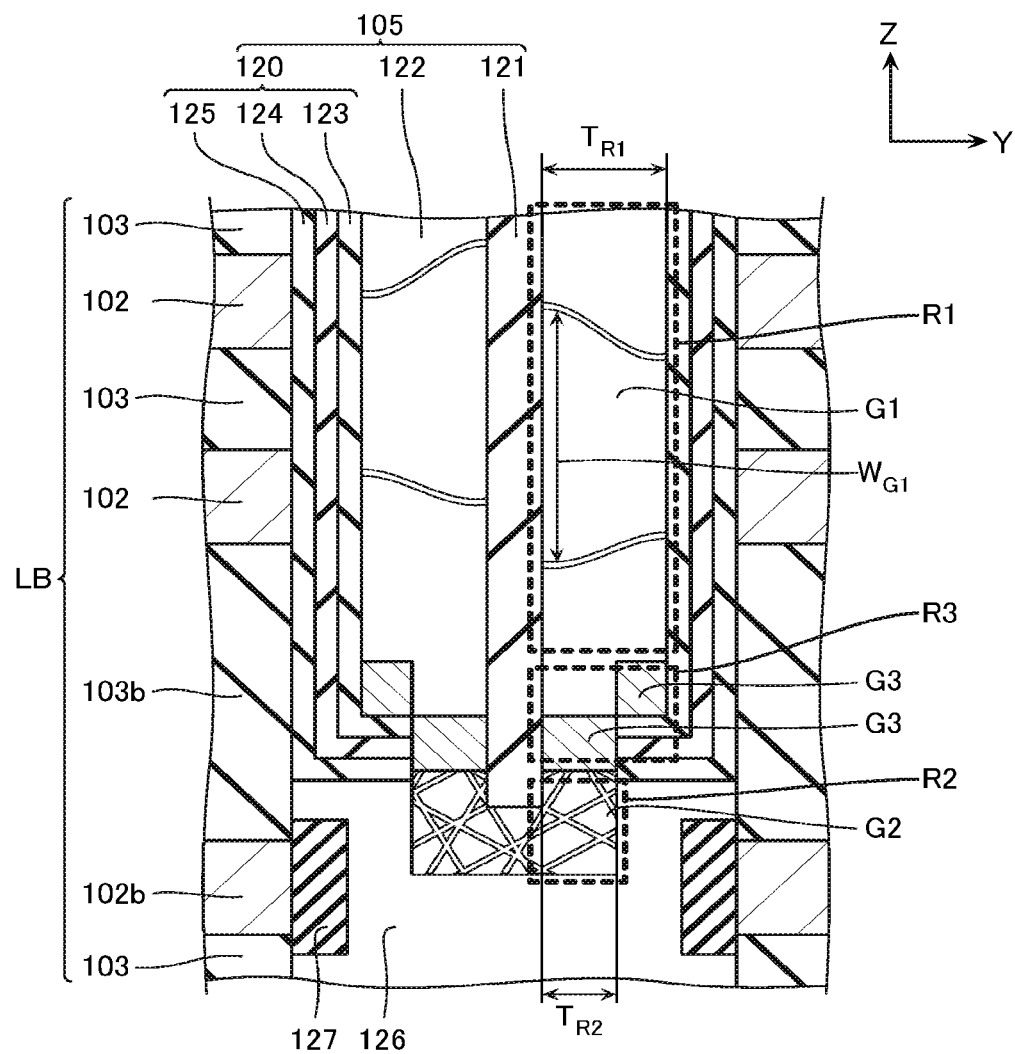
FIG. 31 is a cross-sectional view for describing a modified example of the semiconductor memory device according to the first embodiment.

Note that FIG. 7 shows an example where the silicide layer G3 is not included in the region of the semiconductor layer 122 where film thickness is smaller, but as shown in FIG. 31, the silicide layer G3 is sometimes included also in the region of the semiconductor layer 122 where film thickness is smaller.

Figure 32:
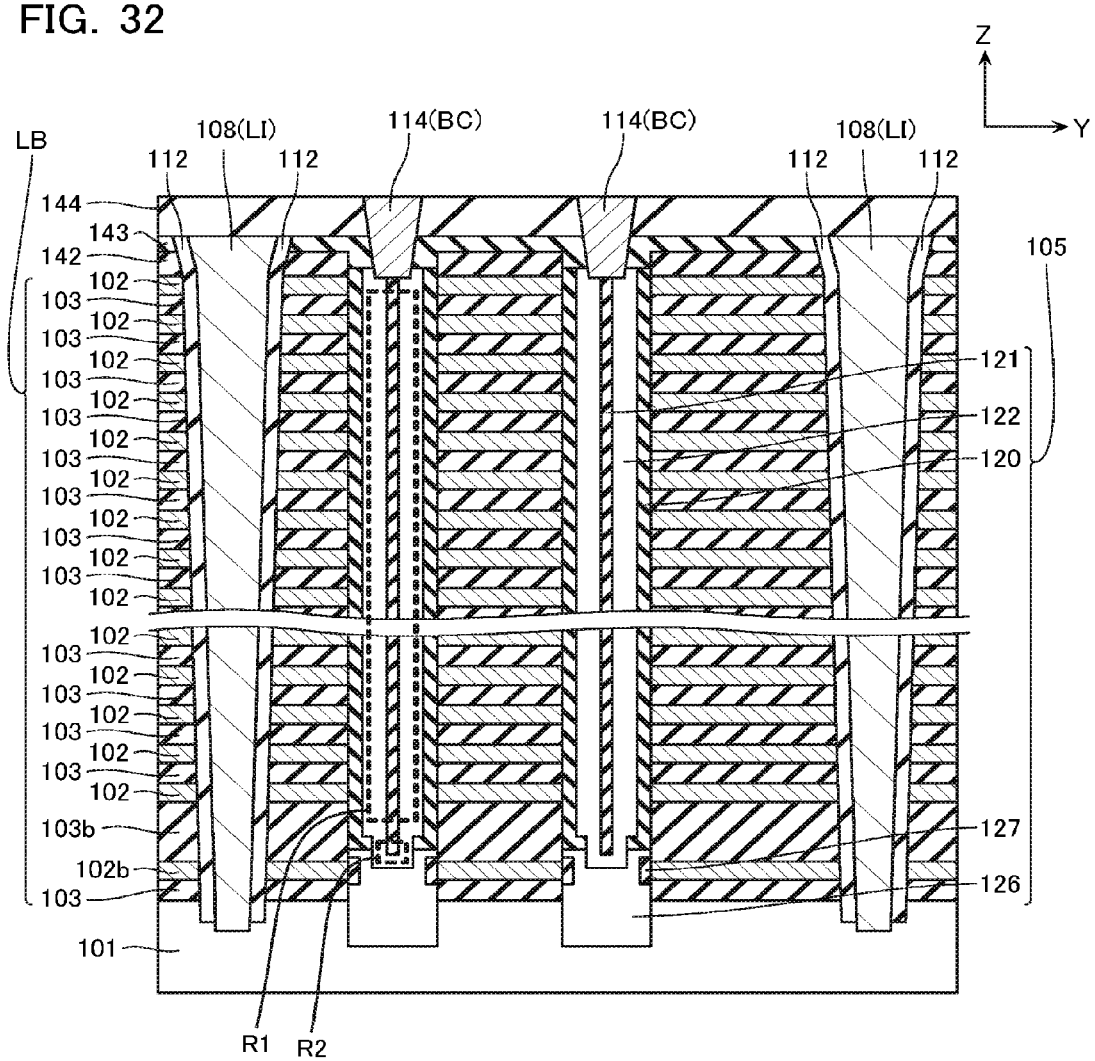
FIG. 32 is a cross-sectional view for describing another modified example of the same semiconductor memory device.

Moreover, as shown in FIG. 32, sometimes, also, the silicide layer G3 does not exist between the first portion R1 and the second portion R2. Such a semiconductor memory device is manufactured when, for example, the silicide layer G3 has disappeared in the heat treatment step. Even in such a case, it is possible to reduce the voltage drop in the semiconductor layer 122 while reducing variation in characteristics of the likes of the memory cell MC or the source side select gate transistor STS.

Second Embodiment

Figure 33:
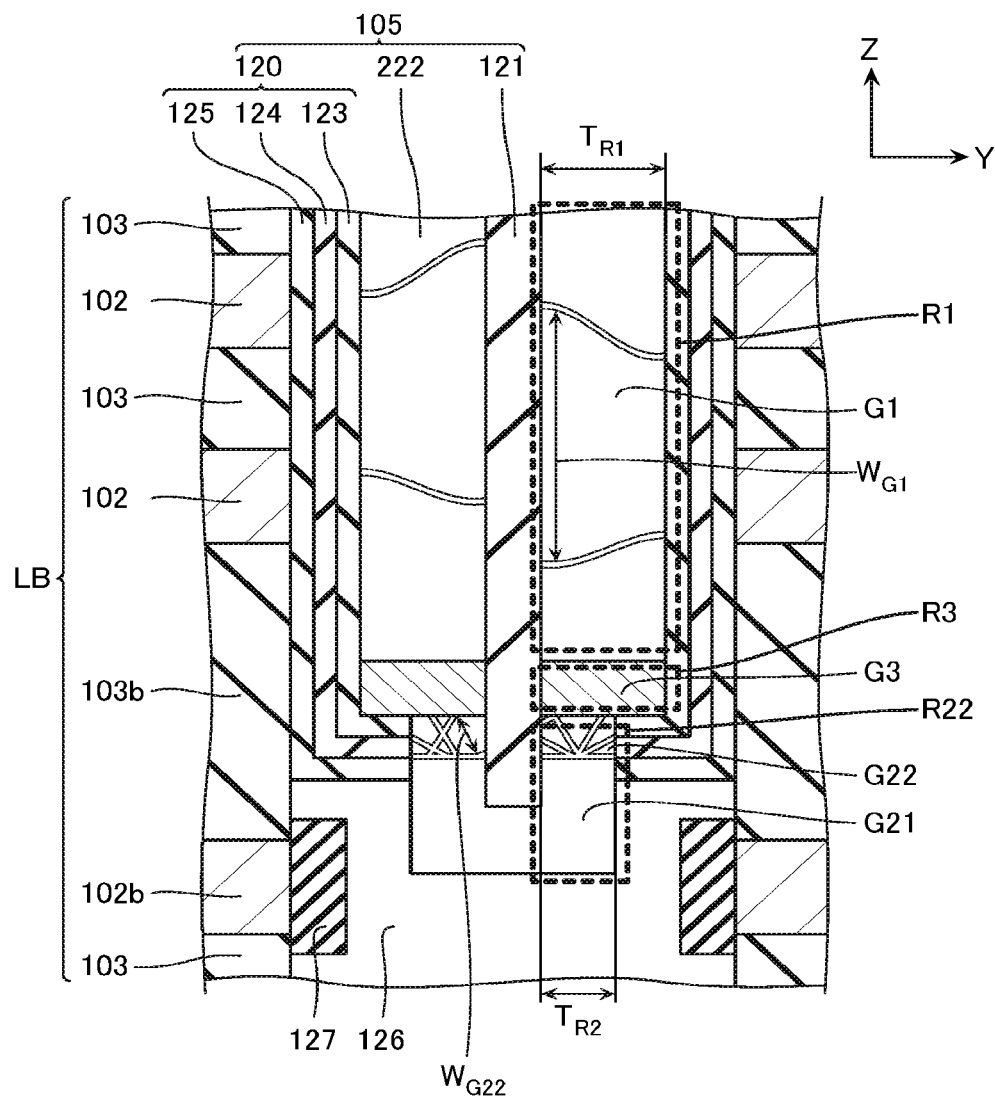
FIG. 33 is a cross-sectional view for describing a semiconductor memory device according to a second embodiment.

FIG. 33 is a cross-sectional view showing a configuration of a semiconductor memory device according to a second embodiment, and shows a portion corresponding to the portion shown in FIG. 7, of the semiconductor memory device according to the first embodiment. Note that in the description below, portions similar to those of the first embodiment will be assigned with identical symbols to those assigned in the first embodiment, and descriptions thereof will be omitted.

As shown in FIG. 33, the semiconductor memory device according to the second embodiment is basically configured similarly to the semiconductor memory device according to the first embodiment, but a configuration of a semiconductor layer 222 differs from the first embodiment. The semiconductor layer 222 is basically configured similarly to the semiconductor layer 122, but a crystalline structure in a second portion R22 is different. The second portion R22 of the semiconductor layer 222 is basically configured similarly to the second portion R2 of the semiconductor layer 122, but includes a monocrystal G21 and a plurality of crystal grains G22.

The monocrystal G21 is a monocrystal of the likes of silicon, for example. The monocrystal G21 has its orientation plane aligned with those of the substrate 101 and the second semiconductor layer 126. Moreover, a lower surface and side surface of the monocrystal G21 contact the second semiconductor layer 126.

A width $W_{G22}$ of the crystal grain G22 is smaller than the width $W_{G1}$ of the crystal grain G1 included in the first portion R1. Moreover, the width $W_{G22}$ of the crystal grain G22 is smaller than the film thickness $T_{R2}$ of the second portion R22.

Note that even in the second embodiment, sometimes, also, as described with reference to FIG. 31, the silicide layer G3 is included in the region of the semiconductor layer 222 where film thickness is smaller, and sometimes, also, as described with reference to FIG. 32, the silicide layer G3 is not provided between the first portion R1 and the second portion R22.

Third Embodiment

Figure 34:
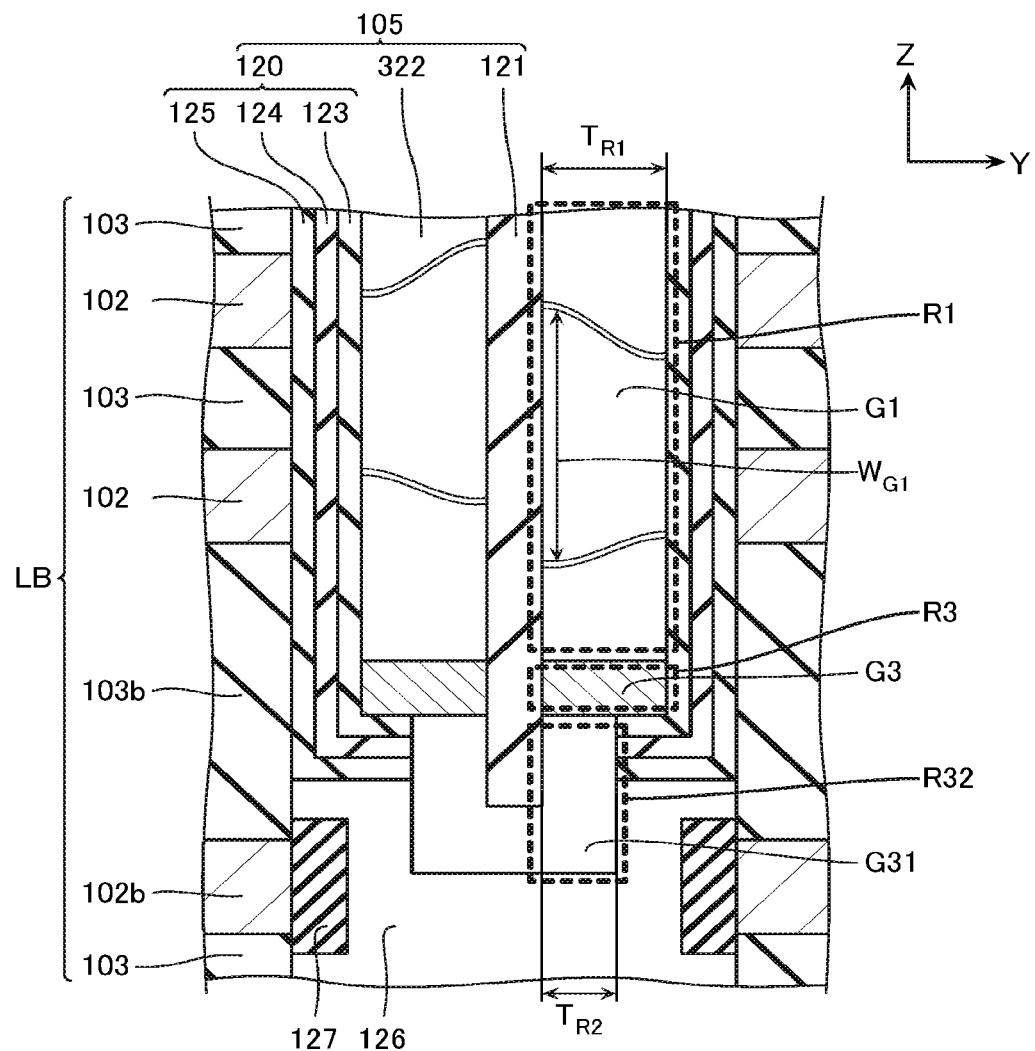
FIG. 34 is a cross-sectional view for describing a semiconductor memory device according to a third embodiment.

FIG. 34 is a cross-sectional view showing a configuration of a semiconductor memory device according to a third embodiment, and shows a portion corresponding to the portion shown in FIG. 7, of the semiconductor memory device according to the first embodiment. Note that in the description below, portions similar to those of the first embodiment will be assigned with identical symbols to those assigned in the first embodiment, and descriptions thereof will be omitted.

As shown in FIG. 34, the semiconductor memory device according to the third embodiment is basically configured similarly to the semiconductor memory device according to the first embodiment, but a configuration of a semiconductor layer 322 differs from the first embodiment. The semiconductor layer 322 is basically configured similarly to the semiconductor layer 122, but a crystalline structure in a second portion R32 is different. The second portion R32 of the semiconductor layer 322 is basically configured similarly to the second portion R2 of the semiconductor layer 122, but the second portion R32 of the semiconductor layer 322 is configured from a monocrystal G31.

The monocrystal G31 is a monocrystal of the likes of silicon, for example. The monocrystal G31 has its orientation plane aligned with those of the substrate 101 and the second semiconductor layer 126. Moreover, a lower surface and side surface of the monocrystal G31 contact the second semiconductor layer 126.

Note that even in the third embodiment, sometimes, also, as described with reference to FIG. 31, the silicide layer G3 is included in the region of the semiconductor layer 322 where film thickness is smaller, and sometimes, also, as described with reference to FIG. 32, the silicide layer G3 is not provided between the first portion R1 and the second portion R32.

Fourth Embodiment

Figure 35:
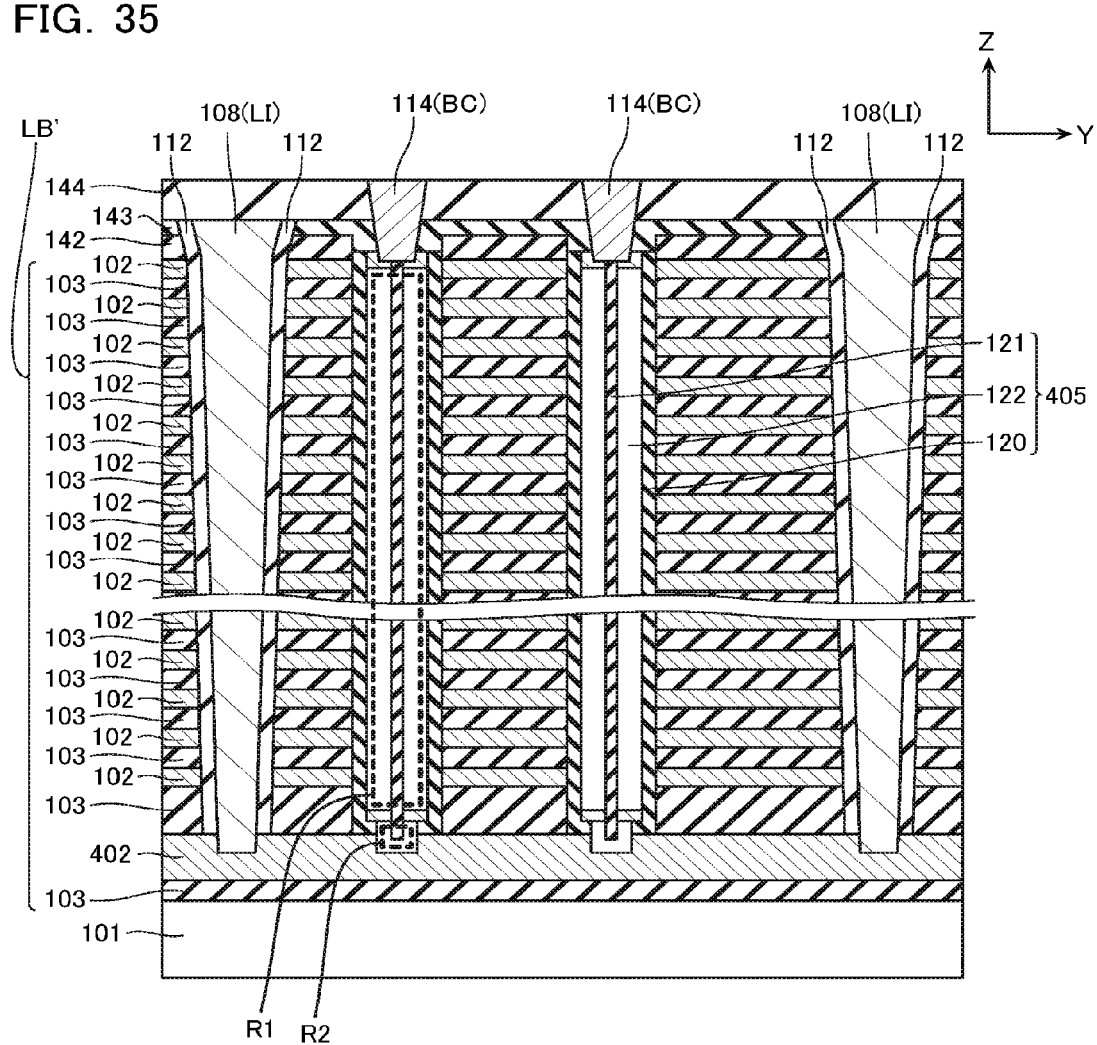
FIG. 35 is a cross-sectional view for describing a semiconductor memory device according to a fourth embodiment.

FIG. 35 is a cross-sectional view showing a configuration of a semiconductor memory device according to a fourth embodiment, and shows a portion corresponding to the portion shown in FIG. 6, of the semiconductor memory device according to the first embodiment. Note that in the description below, portions similar to those of the first embodiment will be assigned with identical symbols to those assigned in the first embodiment, and descriptions thereof will be omitted.

As shown in FIG. 35, in the semiconductor memory device according to the fourth embodiment, a conductive layer 402 is provided above the substrate 101. The conductive layer 402 is formed from the likes of a metal or polysilicon, for example. The conductive layer 402 may have a substantially plate-like shape extending in the X direction and the Y direction, or may have a linear shape extending in the Y or X direction and be arranged in plurality in the X or Y direction.

A stacked body LB' according to the present embodiment is basically configured similarly to the stacked body LB according to the first embodiment, but does not comprise the second conductive layer 102b and the second inter-layer insulating layer 103b.

A memory columnar body 405 according to the present embodiment is basically configured similarly to the memory columnar body 105 according to the first embodiment, but does not comprise the second semiconductor layer 126. Moreover, the lower end of the semiconductor layer 122 according to the present embodiment is connected to an upper surface of the conductive layer 402.

The lower end of the conductive layer 108 according to the present embodiment is connected to the upper surface of the conductive layer 402.

Note that even in the fourth embodiment, sometimes, also, as described with reference to FIG. 31, the silicide layer G3 is included in the region of the semiconductor layer 122 where film thickness is smaller, and sometimes, also, as described with reference to FIG. 32, the silicide layer is not provided between the first portion R1 and the second portion R2.

Other Embodiments

In the first through fourth embodiments above, three-dimensional type semiconductor memory devices were described. However, the above-described technology may also be applied to other than a three-dimensional semiconductor memory device.

Figure 36:
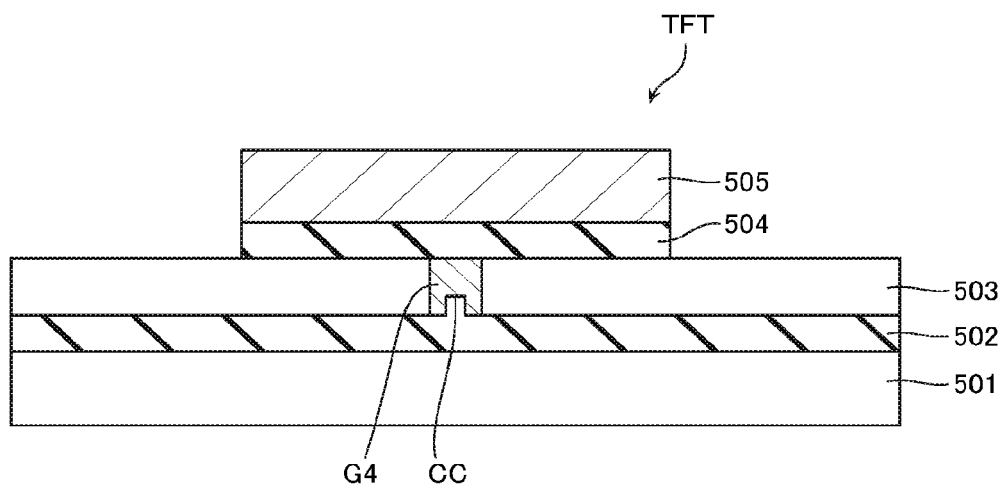
FIG. 36 is a cross-sectional view for describing a semiconductor device according to another embodiment.

For example, FIG. 36 shows a configuration of a thin film transistor TFT (Thin Film Transistor). Such a thin film transistor comprises: a substrate 501; and an insulating layer 502, a semiconductor layer 503, a gate insulating layer 504, and a gate electrode 505 that are stacked sequentially on an upper surface of the substrate 501. The substrate 501 is a semiconductor substrate configured from the likes of monocrystalline silicon (Si), for example. The insulating layer 502 is an insulating layer configured from the likes of silicon oxide ($SiO_2$), for example. The semiconductor layer 503 is a semiconductor layer configured from the likes of silicon, for example, and functions as a channel body of the above-described thin film transistor TFT. The gate insulating layer 504 is an insulating layer configured from the likes of silicon oxide ($SiO_2$), for example. The gate electrode 505 is a conductive layer configured from the likes of a metal or polysilicon, for example.

Moreover, in the example shown in FIG. 36, a concave part CC is provided in the semiconductor layer 503, and furthermore, a silicide layer G4 is provided in a vicinity of this concave part CC.

Such a configuration is formed by, for example, forming the semiconductor layer 503 upwardly of the substrate 501, providing the concave part CC in this semiconductor layer 503, siliciding part of the semiconductor layer 503, and performing the MILC method. As a result, a crystal grain included in the semiconductor layer 503 can be made large, and a voltage drop in the semiconductor layer 503 can be reduced. Moreover, a position of the silicide layer G4 can be preferably controlled by the concave part CC, whereby variation in characteristics between the thin film transistors TFT can be suppressed.

Figure 37:
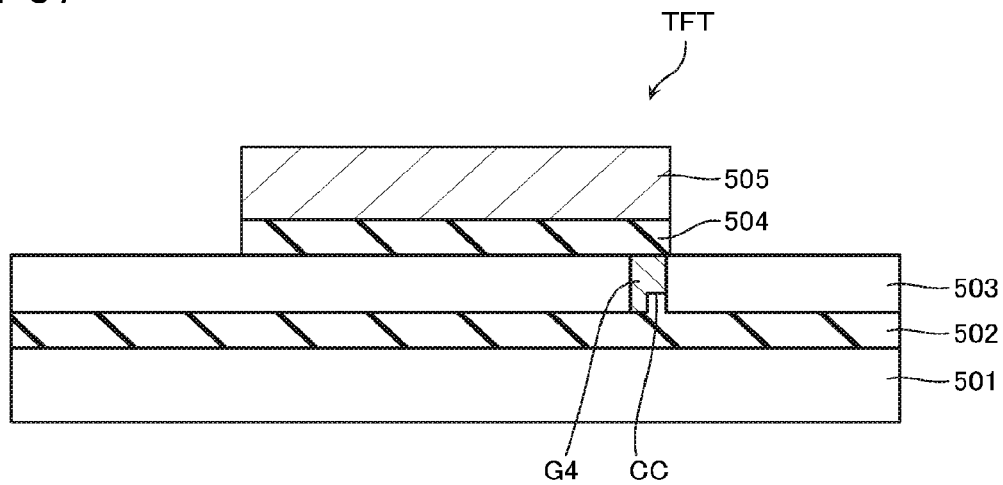
FIG. 37 is a cross-sectional view for describing a semiconductor device according to another embodiment.

Note that as shown in FIG. 37, the concave part CC or the silicide layer G4 may be provided in a vicinity of an end of the gate insulating layer 505, not in a vicinity of the center of the gate insulating layer 505. Moreover, the concave part CC or the silicide layer G4 may be provided on the outside of the gate insulating layer 505.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:
1. A semiconductor memory device, comprising:
   a plurality of control gate electrodes arranged in a first direction intersecting an upper surface of a substrate;

a first semiconductor layer extending in the first direction and facing a plurality of the control gate electrodes from a second direction intersecting the first direction; and a gate insulating layer provided between the control gate electrode and the first semiconductor layer, the first semiconductor layer comprising:
  a first portion extending in the first direction and facing the control gate electrode; and
  a second portion provided on a closer side to the substrate than the first portion,
  a film thickness of the first portion in the second direction being larger than a film thickness of the second portion in the second direction, and
  a crystal grain included in the first portion being larger than a crystal grain included in the second portion.

2. The semiconductor memory device according to claim 1, wherein
  the first portion includes a crystal grain larger than a film thickness of the first portion in the second direction.

3. The semiconductor memory device according to claim 1, wherein
  the crystal grain included in the first portion is larger than a film thickness of the first portion in the second portion, and
  the crystal grain included in the second portion is smaller than a film thickness of the second portion in the second portion.

4. The semiconductor memory device according to claim 1, further comprising
  a second semiconductor layer connected to an end of the first semiconductor layer on a side of the substrate.

5. The semiconductor memory device according to claim 1, wherein
  the first semiconductor layer further comprises a third portion provided between the first portion and the second portion, and
  the third portion includes a metal atom.

6. The semiconductor memory device according to claim 5, wherein
  the third portion includes a silicide.

7. The semiconductor memory device according to claim 1, wherein
  the gate insulating layer includes a charge accumulation part.

8. A semiconductor memory device, comprising:
a plurality of control gate electrodes arranged in a first direction intersecting an upper surface of a substrate;
a first semiconductor layer extending in the first direction and facing a plurality of the control gate electrodes from a second direction intersecting the first direction; and
a gate insulating layer provided between the control gate electrode and the first semiconductor layer,
the first semiconductor layer comprising:
  a first portion extending in the first direction and facing the control gate electrode; and
  a second portion provided on a closer side to the substrate than the first portion,
  a film thickness of the first portion in the second direction being larger than a film thickness of the second portion in the second direction,
  the first portion including a crystal grain larger than the film thickness of the first portion in the second direction, and
  the second portion including a monocrystal.

9. The semiconductor memory device according to claim 8, further comprising
  a second semiconductor layer connected to an end of the first semiconductor layer on a side of the substrate.

10. The semiconductor memory device according to claim 9,
  wherein the second semiconductor layer includes a monocrystal, and
  the monocrystal included in the second portion of the first semiconductor layer has an orientation plane aligned with that of the monocrystal included in the second semiconductor layer.

11. The semiconductor memory device according to claim 8, wherein
  the first semiconductor layer further comprises a third portion provided between the first portion and the second portion, and
  the third portion includes a metal atom.

12. The semiconductor memory device according to claim 11, wherein
  the third portion includes a silicide.

13. The semiconductor memory device according to claim 8, wherein
  the gate insulating layer includes a charge accumulation part.

14. A semiconductor memory device, comprising:
a plurality of control gate electrodes arranged in a first direction intersecting an upper surface of a substrate;
a semiconductor layer extending in the first direction and facing a plurality of the control gate electrodes from a second direction intersecting the first direction; and
a gate insulating layer provided between the control gate electrode and the semiconductor layer,
the semiconductor layer comprising:
  a first portion extending in the first direction and facing the control gate electrode;
  a second portion provided on a closer side to the substrate than the first portion; and
  a third portion provided between the first portion and the second portion,
  a film thickness of the first portion in the second direction being larger than a film thickness of the second portion in the second direction, and
  the third portion including a metal atom of nickel (Ni), cobalt (Co), aluminum (Al), or palladium (Pd).

15. The semiconductor memory device according to claim 14, wherein
  the third portion includes a silicide.

16. The semiconductor memory device according to claim 14, wherein
  the gate insulating layer includes a charge accumulation part.

* * * * *